(12) United States Patent
Corrigan et al.

(10) Patent No.: US 12,215,024 B2
(45) Date of Patent: Feb. 4, 2025

(54) ADAPTIVE MEMS DEVICE, CODEC FOR USE WITH THE MEMS DEVICE AND METHOD FOR PROVIDING DIAGNOSTIC DATA, AT RUN-TIME, ON THE CURRENT CONDITION OF A MEMS DEVICE

(71) Applicant: Infineon Technologies AG, Neubiberg (DE)

(72) Inventors: Darragh Francis Corrigan, Munich (DE); Andreas Wiesbauer, Poertschach (AT); Guangzhao Zhang, Munich (DE)

(73) Assignee: Infineon Technologies AG, Neubiberg (DE)

( * ) Notice: Subject to any disclaimer, the term of this patent is extended or adjusted under 35 U.S.C. 154(b) by 240 days.

(21) Appl. No.: 17/494,316

(22) Filed: Oct. 5, 2021

(65) Prior Publication Data

US 2022/0162061 A1 May 26, 2022

(30) Foreign Application Priority Data

Nov. 20, 2020 (EP) ..................... 20208975

(51) Int. Cl.
*B81C 1/00* (2006.01)
*B81B 7/00* (2006.01)
*H04R 1/04* (2006.01)

(52) U.S. Cl.
CPC .......... *B81C 1/00222* (2013.01); *B81B 7/007* (2013.01); *B81B 7/008* (2013.01); *H04R 1/04* (2013.01); *B81B 2201/0257* (2013.01)

(58) Field of Classification Search
None
See application file for complete search history.

(56) References Cited

U.S. PATENT DOCUMENTS

| 9,238,580 B2* | 1/2016 | Alagarsamy ..... G01N 35/00712 |
| 2010/0219839 A1* | 9/2010 | Steele ................. H04R 29/004 |
| | | 257/E27.013 |
| 2017/0164118 A1* | 6/2017 | Wiesbauer ............... H04R 1/04 |
| 2020/0154223 A1 | 5/2020 | Du et al. |
| 2020/0233039 A1* | 7/2020 | Jorgensen ............... H03F 3/181 |
| 2020/0278205 A1* | 9/2020 | Kraver ...................... B81B 7/02 |

FOREIGN PATENT DOCUMENTS

GB 2466785 A 7/2010

\* cited by examiner

*Primary Examiner* — Duc Nguyen
*Assistant Examiner* — Assad Mohammed
(74) *Attorney, Agent, or Firm* — Slater Matsil, LLP

(57) ABSTRACT

An adaptive MEMS device includes a MEMS microphone and integrated circuitry, wherein the integrated circuitry is electrically connected to the MEMS microphone. The integrated circuitry reads out an output signal from the MEMS microphone and provides the output signal or a rendered output signal, via a first integrated interface, to an external processing device. Additionally, the integrated circuitry determines, at run-time, diagnostic data on the current condition of the MEMS device and provides, at run-time, the diagnostic data, via a second integrated interface, to the external processing device.

20 Claims, 11 Drawing Sheets

ADAPTIVE MEMS DEVICE, CODEC FOR USE WITH THE MEMS DEVICE AND METHOD FOR PROVIDING DIAGNOSTIC DATA, AT RUN-TIME, ON THE CURRENT CONDITION OF A MEMS DEVICE

This application claims the benefit of European Patent Application No. 20208975, filed on Nov. 20, 2020, which application is hereby incorporated herein by reference.

TECHNICAL FIELD

Embodiments of the disclosure are related to adaptive MEMS devices, CODECs for use with the MEMS devices and methods for providing diagnostic data, at run-time, on the current condition of a MEMS device. Other embodiments relate to a microphone with control interface to read out diagnostic and status information, and adjust performance parameters, during run-time. Additional embodiments relate to microphones with diagnostic features.

BACKGROUND

MEMS microphones (MEMS=microelectromechanical system) are present in a large number of applications, from audio recording in consumer electronics, such as smartphones, to the detection of gas in photoacoustic sensors, for example in large scale process facilities. As a result, there is an ever increasing interest in extended functionality and reliability for such MEMS devices.

Currently MEMS microphones are data transmitters only. The options to adjust performance parameters are limited, and there are no possibilities to read out calibration information or perform run-time diagnostics. This may restrict the output dynamic range of microphones and can result in field problems when microphone issues cannot be readily diagnosed.

Damaged microphone membranes can be a common failure mechanism that appears in the field. Traditionally, an acoustic test would be needed to discover a damaged membrane in the form of a sensitivity measurement but this test is not always possible.

Generally, there is a need on the field of MEMS microphones for an approach to implement improved MEMS microphones having an adequate long term sensitivity for the audio detection without essentially increasing the fabrication requirements.

Regarding current MEMS microphone solutions, there is also a need for an improved concept in order to provide extended functionality for MEMS microphones, such as determining diagnostic data, for example to provide such data to communicate membrane damage and avoid or minimize field problems.

Such needs can be solved by the MEMS device according to claim 1. Further, specific implementations of the device are defined in the dependent claims.

SUMMARY

Embodiments of the disclosure comprise an adaptive MEMS device, the MEMS device comprising a MEMS microphone and integrated circuitry. The integrated circuitry is electrically connected to the MEMS microphone and is configured to read out an output signal from the MEMS microphone and to provide the output signal or a rendered output signal, via a first integrated interface, to an external processing device. Moreover, the integrated circuitry is configured to determine, at run-time, diagnostic data on the current condition of the MEMS device and to provide, at run-time, the diagnostic data, via a second integrated interface, to the external processing device.

Embodiments of the disclosure comprise a CODEC for use with the MEMS device according to any embodiment or aspect of the disclosure, wherein the external processing device comprises the CODEC and wherein the CODEC comprises an interface for communication. Furthermore, the CODEC is configured to perform at least one of providing, at run-time, a control information via the interface for the MEMS device and receiving, at run-time, diagnostic data on the current condition of the MEMS device, via the interface, from the MEMS device.

Embodiments of the disclosure comprise a method for providing diagnostic data, at run-time, on the current condition of the MEMS device according to any embodiment or aspect of the disclosure, via the second integrated interface, to the external processing device. The method comprises determining, at run-time, the diagnostic data on the current condition of the MEMS device and providing the diagnostic data to the external processing device, via the second integrated interface.

Further embodiments are described in the dependent claims.

BRIEF DESCRIPTION OF THE DRAWINGS

The drawings are not necessarily to scale, emphasis instead generally being placed upon illustrating the principles of the disclosure. In the following description, various embodiments of the disclosure are described with reference to the following drawings, in which.

Before discussing the present embodiments in further detail using the drawings, it is pointed out that in the figures and the specification identical elements and elements having the same functionality and/or the same technical or physical effect are usually provided with the same or equivalent reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, a plurality of details is set forth to provide a more throughout ex-planation of embodiments of the disclosure. However, it will be apparent to those skilled in the art that embodiments of the disclosure may be practiced without these specific details. In other instances, well-known structures and devices are shown in block diagram form rather than in detail in order to avoid obscuring embodiments of the disclosure. In addition, features of the different embodiments described herein after may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

Figure 1:
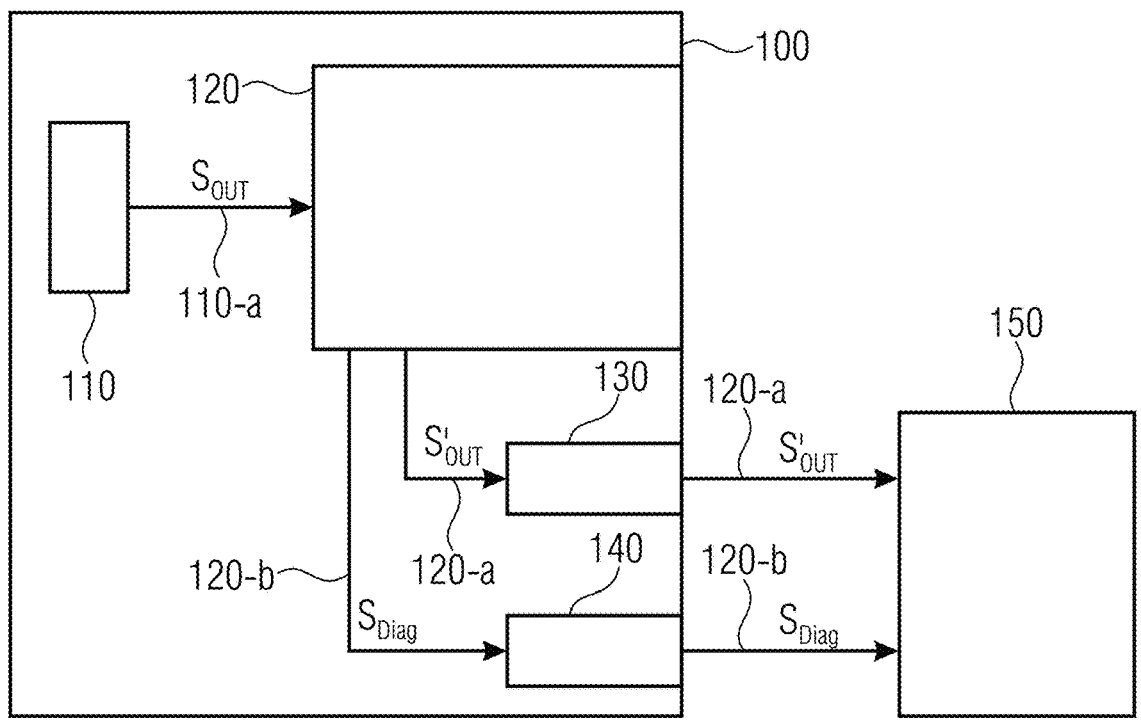
FIG. 1 shows a schematic view of an adaptive MEMS device according to an embodiment of the disclosure.

FIG. 1 shows a schematic view of an adaptive MEMS device according to an embodiment of the disclosure. The adaptive MEMS device 100 comprises a MEMS microphone 110, an integrated circuitry 120, a first integrated interface 130 and a second integrated interface 140. The integrated circuitry 120 is electrically connected to the MEMS microphone 110.

According to an embodiment, the integrated circuitry 120 is configured to read out an output signal Sour 110-*a* from the MEMS microphone 110 and to provide the output signal Sour or a rendered output signal $S'_{OUT}$ 120-*a*, via a first integrated interface 130, to an external processing device 150. The integrated circuitry 120 is configured to determine, at run-time, diagnostic data $S_{Diag}$ 120-*b* on the current condition of the MEMS device and to provide, at run-time, the diagnostic data $S_{Diag}$ 120-*b*, via a second integrated interface 140, to the external processing device 150. Thus, the integrated circuitry 120 is connected to each of the interfaces 130, 140 and each of the interfaces 130, 140 may be coupled during an operation condition to the external processing device 150.

For using the functionality of the MEMS microphone 110 as an audio transducer, the integrated circuitry 120 reads out the output signal Sour 110-*a*, for example an audio signal, from the microphone 110. The output signal can be rendered ($S'_{OUT}$ 120-*a*), for example by amplification and/or by analog to digital conversion etc., and is provided by the integrated circuitry 120 via the first integrated interface 130 to the external processing device 150, for example a CODEC. In general, a Codec is a device or computer program which encodes or decodes a digital data stream or signal, for example. Optionally, the output signal may be provided without being rendered, such that $S'_{OUT}=S_{OUT}$.

MEMS microphones 110 have usually a miniaturized microphone design with a movable or displaceable (=deflectable) membrane and an associated (fixed) backplate (=counterelectrode), similar as utilized in condenser microphones. Over the lifetime of the microphone 110, the microphone may be exposed to mechanical stress or loads (e.g., mechanical shocks) and/or may be exposed to aggressive or corrosive environments, which may lead to a damage or degeneration of a mechanical functionality of the microphone, e.g. of the membrane or the backplate, or to a degeneration of an electric or electronic functionality of the MEMS microphone. That may result in a deterioration of the signal-to-noise ratio or other performance parameters of the MEMS microphone. In order to detect such alterations or other changes in the adaptive MEMS device 100 having the MEMS microphone 110, the integrated circuitry 120 is configured to determine, at run-time, diagnostic data $S_{Diag}$ 120-*b* on the current condition of the MEMS device 100. Determination of the diagnostic data $S_{Diag}$ 120-*b*, or diagnostic information can be performed by running self-tests or self-diagnosis. The integrated circuitry 120 may stimulate the microphone 110 or its membrane in order to evaluate a response signal to gather information on its current condition. Additionally or alternatively, measurements of operating parameters, such as output signals of the circuitry elements of the integrated circuitry, for example voltages or currents, may be performed in order to compare the measured operating parameters to nominal parameters to determine information about the current condition of the device 100.

The diagnostic data $S_{Diag}$ 120-*b* determined may be raw measurements, to be analyzed in the external processing device 150, or processed data, for example interpreted information on the current condition of the device 100, for example information such as 'damaged membrane'.

Said diagnostic data is then provided by the integrated circuitry 120, via the second integrated interface 140, to the external processing device 150. The second integrated interface 140 enables communication between device 100 and external processing device 150, in order to take advantage of the diagnostic data $S_{Diag}$ 120-*b*, for example to recognize a current operating parameter, a (unintended) change of an operating parameter of the MEMS device or even a device damage, malfunction and/or functional disorder to schedule repair or exchange or to take other countermeasures.

The second integrated interface 140 may be a control interface, configured for one of adjusting of internal microphone, e.g. MIC parameters, reading out calibration information, and self-diagnostics.

Embodiments of the disclosure allow to use the integrated circuitry 120 of the adaptive MEMS device 100 comprising the MEMS microphone 110 to determine diagnostic data $S_{Diag}$ 120-*b* on the current condition of the MEMS device 100 and to provide, at run-time, the diagnostic data $S_{Diag}$ 120-*b*, via the second integrated interface 140, for example a control interface, to the external processing device 150, in addition to the integrated circuitry's function to read out an output signal Sour 110-*a* from the MEMS microphone 110 and to provide said output signal $S_{OUT}$ 110-*a* or a rendered output signal $S'_{OUT}$ 120-*a* via the first integrated interface 130.

Synergetic use of the integrated circuitry 120 (e.g., to determine the diagnostic data $S_{Diag}$ 120-*b* and to read out the output signal Sour 110-*a* from the MEMS microphone 110) may increase efficiency for running integrated self-tests for the MEMS microphone 110 or the whole device 100. By using the integrated circuitry 120, there may be no need for external measurements over the whole lifetime of the device. This may enable insights concerning the status or operating parameter of the device even in applications, wherein it is not possible to perform external measurements or tests, for example if the device is integrated within an encapsulation or embedded in a system.

The diagnostic data $S_{Diag}$ 120-*b* may comprise information (e.g., an electric and/or electronic condition) about leakages, for example causing parasitic impedances, status information (e.g., mechanical condition) on the membrane of the microphone, for example indicating a damaged or destroyed microphone membrane or information on micro cracks on said membrane. Furthermore, the diagnostic data $S_{Diag}$ 120-*b* may also comprise information on the integrated circuitry 120, e.g. electric or electronic conditions, for example concerning current leakages or any circuitry damage.

The generation and provision of the diagnostic data $S_{Diag}$ 120-*b* by the integrated circuitry 120 may be performed at run-time, for example during operation, and by stimulating the microphone 110 or its membrane by the integrated circuitry 120. Data generation at run-time may be performed during the device's function as an audio transducer, for example, without interrupting this or other tasks of the device. Furthermore, a determination and provision of the diagnostic data $S_{Diag}$ 120-*b*, at run-time, may comprise performing said actions in a time span (e.g., in or nearly in real-time) that is short or for example at least in a same time scale as an, for example undesired, effect, that may be detected and communicated by the diagnostic data, in order to provide countermeasures or at least information about the effect in real-time (=at run-time). Moreover, the integrated circuitry 120 may perform triggered tests or self-tests, such as autonomous tests, for example in certain time intervals, in order to determine or collect the diagnostic data $S_{Diag}$ 120-*b*.

The second integrated interface 140 may be implemented through I²C (Inter-Integrated Circuit), SPI (Serial Peripheral Interface), GPIO (General Purpose Input/Output), Soundwire® or a similar technology.

In other words, embodiments of the disclosure allow using the second integrated interface 140, for example a mic bidirectional interface or rather microphone bidirectional interface to enable new, for example non-typical, features, not typical for microphones or MICs.

Non-typical features may be one or more of the following, wherein the diagnostic data $S_{Diag}$ 120-*b* may comprise information for providing the features:

MEMS leakage detection, for example based on measuring and digitizing some of the operating points of the microphone 110 (MIC) amplifier and providing this information through the interface, for example the second integrated interface 140, upon request, Digital driver strength control (The MIC may need to drive digital signal to a host, if the digital signals are driven with high slew rate one can suffer RFI (Radio Frequency Interference) problems. Therefore, reducing drive strength can reduce such RFI problems), MIC supply voltage monitoring, for example by measuring supply voltage values and digitizing those for system optimization, MIC temperature monitoring, for example by providing temperature values on demand, Calibration information, for example used MEMS bias voltage for estimation of the MEMS compliance, LFRO (Low Frequency Roll Off) value, that may be useful for matching mics, CHIP ID (e.g., chip identification), calibration time stamp and others, Acoustic overload detection; and Presence of ultrasound signal detection.

In accordance to an aspect of the disclosure the second integrated interface 140 comprises the first integrated interface 130 and the integrated circuitry 120 is configured to provide the output signal $S_{OUT}$ 110-*a* or a rendered output signal $S'_{OUT}$ 120-*a*, via the second integrated interface 140, to the external processing device 150.

Therefore, there may be only one interface, namely the second interface 140, implemented in the MEMS device 100, providing additionally the functionality of the first integrated interface 130. In this case, the second integrated interface 140 is used for both the output signal Sour 110-*a* or rendered output signal $S'_{OUT}$ 120-*a*, e.g. audio data and the diagnostic data $S_{Diag}$ 120-*b*. In other words, first integrated interface 130 and second integrated interface 140 may be one and the same. Such a joint interface may be implemented via SoundWire® or I2S (Inter-IC Sound). As a consequence, the number of interface pins may be reduced.

In accordance to an aspect of the disclosure, the second integrated interface 140 may be implemented as a bidirectional integrated interface, wherein the integrated circuitry 120 is configured to receive, via the bidirectional interface, at run-time, control information for setting an operation characteristic of the MEMS device 100 from the external processing device 150. The control information may be used to adjust performance or control parameters of the MEMS microphone 110.

Bidirectionality of the second integrated interface may enable two-sided communication between the adaptive MEMS device 100 and the external processing device 150. In this way, the MEMS device 100 may be independent of self-adaptation in order to maintain an operating point, e.g. a desired, defined or optimal operating point. The MEMS device 100 can provide its own current condition via the diagnostic data $S_{Diag}$ 120-*b* to the external processing device 150, wherein the external processing device 150 may take the diagnostic data $S_{Diag}$ 120-*b* and additional information, for example environmental parameters, into consideration in order to feedback the control information to the MEMS device 100 in order to set desired, defined or best possible operating characteristics for the device's functionality.

In accordance to an aspect of the disclosure, the integrated circuitry 120 is configured to determine, at run-time, the diagnostic data $S_{Diag}$ 120-*b* based on the control information received, at run-time, via the bidirectional integrated interface from the external processing device 150.

Determination of the diagnostic data $S_{Diag}$ 120-*b* may be performed as an autonomous self-test or as a triggered test, for example triggered by the control information received, at run-time, via the bidirectional integrated interface from the external processing device 150. Such a triggering may be performed in case of an event, such as a sudden shock of the device 100 that may have caused damage, for example on the membrane. In addition, computation efforts can be reduced on the integrated circuitry 120 if tests are for example not started in certain time intervals, but only when needed.

In accordance to an aspect of the disclosure, the integrated circuitry 120 is configured to control an operating condition of the MEMS microphone 110 based on the control information received, at run-time, via the bidirectional integrated interface, from the external processing device 150.

Controlling an operation condition of the MEMS microphone 110 may comprise at least one of resetting a charge pump, reducing a PDM output slew rate, adjusting a MEMS microphone performance parameter and calibrating the MEMS microphone 110. Furthermore, controlling an operation condition of the microphone 110 may enable compensation of damage, for example a damaged membrane of the microphone 110, or compensation of changed external conditions of the device 100, for example by setting parameters of the device in such a way that they counteract or mitigate the impact of the damage or the external conditions on the device 100. Moreover, the bidirectional integrated interface can be used for example on the one hand to report changes or damage, e.g. sensed by the microphone 110 and evaluated by the integrated circuitry 120, to the external processing device 150, in order to receive on the other hand control information adapted to compensate the changes or damage reported.

In accordance to an aspect of the disclosure the integrated circuitry 120 comprises a memory and is configured to store the diagnostic data $S_{Diag}$ 120-$b$ in the memory. The memory may be a non-volatile memory, for example of the microphone. Since the diagnostic data $S_{Diag}$ 120-$b$ may comprise one or more of a calibration data and a characterization information from a microphone test, reading out such stored, e.g. calibration data may be used for additional features and/or to provide additional information, such as chip ID, frequency response compensation or linearity compensation.

In accordance to an aspect of the disclosure, the integrated circuitry 120 is configured to sense the output signal Sour 110-$a$ of the MEMS microphone 110 and to compare the sensed output Sour 110-$a$ signal to a reference value or reference signal. Consequently, the comparison result provides the diagnostic data $S_{Diag}$ 120-$b$.

A comparison of the sensed output signal Sour 110-$a$ to a reference value or reference signal can be a computationally inexpensive way to determine the diagnostic data $S_{Diag}$ 120-$b$. The integrated circuitry 120 may be able to compare the output signal Sour 110-$a$ to a plurality of reference values or reference signals, for example in order to determine a differentiated information on the current condition of the device. For example, in this case, it may be possible to supervise the device 100 gradually, e.g. over time. The output signal Sour 110-$a$ may be a voltage, or a differential signal, for example of an amplifier or a pair of amplifiers. In addition, the reference signal may be a target signal, that may be determined a priori.

In accordance to an aspect of the disclosure the diagnostic data $S_{Diag}$ 120-$b$ comprises an information on a leakage impedance of the MEMS microphone 110.

Over the lifetime of the device, for example especially in rough or corrosive environments, degradation of the microphone 110 causing leakages is possible. For example, by comparing a nominal voltage of the microphone to a reference voltage, leakage currents and by that leakages and leakage impedances can be detected.

In accordance to an aspect of the disclosure at least one of the MEMS microphone 110 and the integrated circuitry 120 are configured to be stimulated with a test stimulus and the integrated circuitry 120 is configured to evaluate a resulting response signal in reaction to the test stimulus in order to determine the diagnostic data $S_{Diag}$ 120-$b$, or the integrated circuitry 120 is configured to provide the resulting response signal, via the second integrated interface 140, to the external processing device 150.

Individual stimulation of the microphone 110 or the integrated circuitry 120 may be used in order to generate a differentiated information on damage or alteration of areas of the device 100. Countermeasures might be different or the severity of the damage might be evaluated differently, based on the area of the device in which they occurred. Evaluation of the response signal in reaction to the test stimulus can either be performed by the integrated circuitry 120 itself, for example as a part of an autonomous self-test, or for example by the external processing device 150, for which the integrated circuitry 120 may be configured to provide the resulting response signal via the second integrated interface 140. Moreover, evaluation of the resulting response signal may comprise comparing the response signal to a target response signal or a reference response signal, which may be determined a priori. Furthermore, the test stimulus may be a square wave test stimulus.

In accordance to an aspect of the disclosure the integrated circuitry 120 is configured to generate the test stimulus for the stimulation, or the integrated circuitry 120 is configured to receive, via the second integrated interface 140, the test stimulus from the external processing device 150.

By generating or triggering the test stimulus, the integrated circuitry 120 can run an autonomous self-test on the device 100. This may be done at certain time intervals in order to monitor the condition of the device 100, the microphone 110 or the integrated circuitry 120 itself. Alternatively, the test stimulus can be provided by the external processing device 150, via the second integrated interface 140, for example to save computational resources on the MEMS device 100.

In accordance to an aspect of the disclosure the integrated circuitry 120 is configured to stimulate, at run-time, a resonance frequency of the MEMS microphone 110. Furthermore, the integrated circuitry 120 is configured to evaluate a resulting resonance response of the MEMS microphone 110 in reaction to the stimulation of the resonance frequency in order to determine the diagnostic data $S_{Diag}$ 120-$b$. Alternatively, the integrated circuitry 120 may be configured to provide the resulting resonance response of the MEMS microphone 110 in reaction to the stimulation of the resonance frequency, via the second integrated interface 140, to the external processing device 150.

Stimulation or triggering of a resonance frequency of the microphone 110 may enable detection of even only lightly damaged membranes, for example comprising micro cracks. Evaluation of the resulting resonance response may be performed internally by the integrated circuitry 120 or externally, for example by the external processing device 150. By using the integrated circuitry 120, the device may be independent of external processing, such that it may monitor itself, for example by regularly performed self-tests. By the latter option, the computational power required can be outsourced to the external processing device 150, for example such that the integrated circuitry 120 can be implemented as an inexpensive or low-cost component with low processing power.

In accordance to an aspect of the disclosure the MEMS microphone 110 is a digital output MEMS microphone or an analog output microphone.

The MEMS microphone 110 can be a microphone with an analog output or digital output for audio data. The second integrated interface 140 according to the disclosure may provide improved effects for digital and analog microphones 110. For example, for a digital output MEMS microphones, the improved effects may comprise improvement of the output dynamic range, for example by adjusting performance parameters, for example sensitivity, SNR, AOP (Acoustic Overload Point). In other words, embodiments of the disclosure may enable a digital microphone to output the full MEMS dynamic range. For example, in essence, embodiments according to the disclosure may be the same, or implemented in a same way, for both types of microphones, and in both cases a second integrated control interface 140, e.g. a separate interface may be required anyway, for example in order to run self-tests or to enable adjustment of performance parameters. Whether a microphone is "digital" or "analog" may refer e.g., only to the format of the output signal Sour 110-$a$, e.g. output audio signal, where an analog microphone may provide an analog voltage, and a digital microphone may pass the signal through an Analog to Digital Converter to provide a digital signal. Integrated circuitries 120, e.g. ASICs of both "analog" and "digital" microphones may contain both analog circuitry and digital circuitry, e.g. circuitry configured to provide a digital signal chain. So, in both cases, solutions according to aspects of the disclosure, for example a second integrated interface 140 to provide diagnostic data $S_{Diag}$ 120-$b$ and/or integrated circuitry 120 configured to determine diagnostic data $S_{Diag}$ 120-$b$ may be implemented equivalently, for example for digital and analog output microphones.

In accordance to an aspect of the disclosure the integrated circuitry 120 comprises an ASIC and the ASIC comprises the second integrated interface 140.

A MEMS device 100 with an ASIC (Application Specific Integrated Circuitry) can be produced in large numbers with low costs. Integration of the second integrated interface 140 in the ASIC may help further reduce costs and wiring effort.

In other words, embodiments of the disclosure comprise a microphone ASIC. This ASIC may also include an I²C, SPI, GPIO or Soundwire® interface, for example the second integrated interface 140, which may be used to control the microphone performance during run-time, or to read out status or diagnostic registers. Self-diagnostic procedures can also be triggered by writing to specific register bits, for example triggered by the external processing device 150, via the second integrated interface 140.

Embodiments of the disclosure comprise a CODEC for use with the MEMS device 100 explained above, wherein the external processing device 150 comprises the CODEC and wherein the CODEC comprises an interface for communication. Furthermore, the CODEC is configured to perform at least one of providing, at run-time, a control information via the interface for the MEMS device and receiving, at run-time, diagnostic data $S_{Diag}$ 120-$b$ on the current condition of the MEMS device 100, via the interface, from the MEMS device 100.

Embodiments of the disclosure comprise a method for providing diagnostic data $S_{Diag}$ 120-$b$, at run-time, on the current condition of the MEMS device according to any embodiment or aspect of the disclosure, via the second integrated interface 140, to the external processing device 150. The method comprises determining, at run-time, the diagnostic data $S_{Diag}$ 120-$b$ on the current condition of the MEMS device and providing the diagnostic data $S_{Diag}$ 120-$b$ to the external processing device 150, via the second integrated interface 140.

The CODEC for use with the MEMS device 100 may be able to provide the control information and receive the diagnostic data $S_{Diag}$ 120-$b$ in case of a bidirectional second interface. In this case the external processing device 150 may comprise, for example in addition to the CODEC, a calculation unit in order to determine the control information based on the diagnostic data $S_{Diag}$ 120-$b$ received. In this way, the external processing device 150 may optimize the MEMS device 100, for example by adjusting performance or control parameters of the MEMS microphone 110 via the control information. Moreover, the CODEC may be configured to recognize strange behavior of the MEMS device 100 and to trigger a self-test of the MEMS device 100.

In accordance to an aspect of the disclosure determining, at run-time, the diagnostic data $S_{Diag}$ 120-$b$ comprises at least one of sensing the output signal Sour 110-$a$ of the MEMS microphone 110, comparing the sensed output signal Sour 110-$a$ to a reference value or reference signal and determining, at run-time, the diagnostic data $S_{Diag}$ 120-$b$ based on the comparison result and stimulating, with a test stimulus, the MEMS device 100 and evaluating a resulting response signal in reaction to the test stimulus in order to determine the diagnostic data $S_{Diag}$ 120-$b$; and stimulating, at run-time, a resonance frequency of the MEMS device 100 and evaluating a resulting resonance response of the MEMS device 100 in reaction to the stimulation of the resonance frequency in order to determine the diagnostic data $S_{Diag}$ 120-$b$.

Selecting one or more methods for the determination of the diagnostic data $S_{Diag}$ 120-$b$ may be performed based on additional information, such as a detected shock of the device 100, or an analysis of the output signal Sour 110-$a$ provided via the first integrated interface 130. Such additional information may indicate a certain failure type of the MEMS device 100. According to this, a suitable method, for example checking for micro cracks by stimulating or exciting a resonance frequency, or comparing the sensed output signal Sour 110-$a$ to a reference value in order to detect parasitic impedances, may be chosen. On the other hand, any of these test methods may be performed autonomously by the MEMS device 100 as self-diagnosis, for example in certain time intervals, in order to minimize the possibility of undetected device damage.

Embodiments of the disclosure comprise a computer readable digital storage medium having stored thereon a computer program having a program code for performing, when running on a computer, any of the methods explained.

FIG. 1$a$ shows a variation of the adaptive MEMS-device of FIG. 1 according to a further embodiment of the disclosure. FIG. 1 shows MEMS device 160 with elements according to FIG. 1, but wherein the second integrated interface 140 comprises the first integrated interface 130. Furthermore, integrated circuitry 120 comprises a memory 170.

Memory 170 may be used to store diagnostic data $S_{Diag}$ 120-$b$, in order to read out said data $S_{Diag}$ 120-$b$, e.g. if or when necessary. Results of self-tests may, for example, be buffered before being read out and transmitted to the external processing device 150, e.g. in order to evaluate the data. For example, by storing calibration data or calibration information in the memory 170, manipulation and/or analysis of such data may enable run-time optimization of the microphone.

Figure 1A:
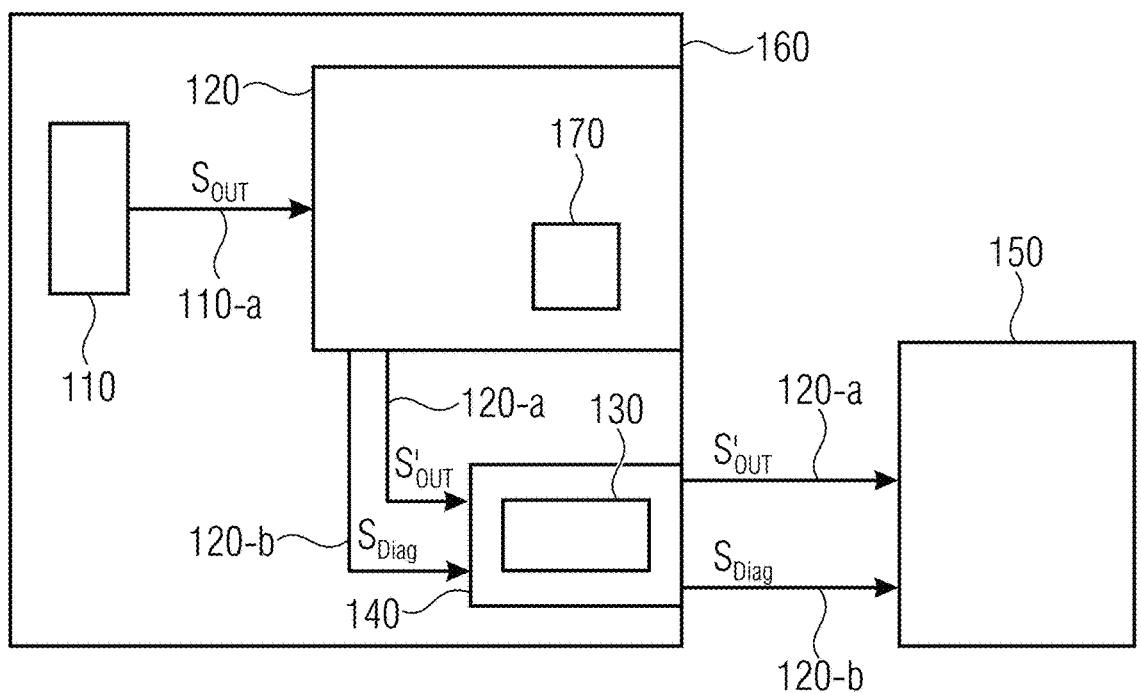
FIG. 1a shows a variation of the adaptive MEMS device of FIG. 1 according to a further embodiment of the disclosure.

The second integrated interface 140 comprising the first integrated interface 130, as shown in FIG. 1a, is an example of functional integration of the providing of the output signal $S_{OUT}$ 110-a or rendered output signal $S'_{OUT}$ 120-a in the second integrated interface 140. Embodiments according to the disclose may comprise only one single interface, namely the second integrated interface 140 that is configured to provide the functionality of the first and second integrated interface. This single interface may be a bidirectional integrated interface. In other words, the second integrated interface 140 comprising the first integrated interface 130 may not be limited to the integration of the hardware of the first integrated interface 130 into the second integrated interface 140, but the integration of the functionality of the first integrated interface 130 in the, e.g. bidirectional, second integrated interface 140, such that a hardware element for the first integrated interface 130 may be absent. Therefore, as shown in FIG. 1a, the second integrated interface 140 may receive the diagnostic data $S_{Diag}$ 120-b and the rendered output data $S'_{OUT}$ 120-a. In this case, the integrated circuitry 120 may be configured to provide the diagnostic data $S_{Diag}$ 120-b and the rendered output data $S'_{OUT}$ 120-a to the external processing device 150, via the second integrated interface 140.

By reducing the number of interfaces, the number of interface pins may be reduced, which may lead to a simplified layout, that may be produced with reduced costs.

Figure 2:
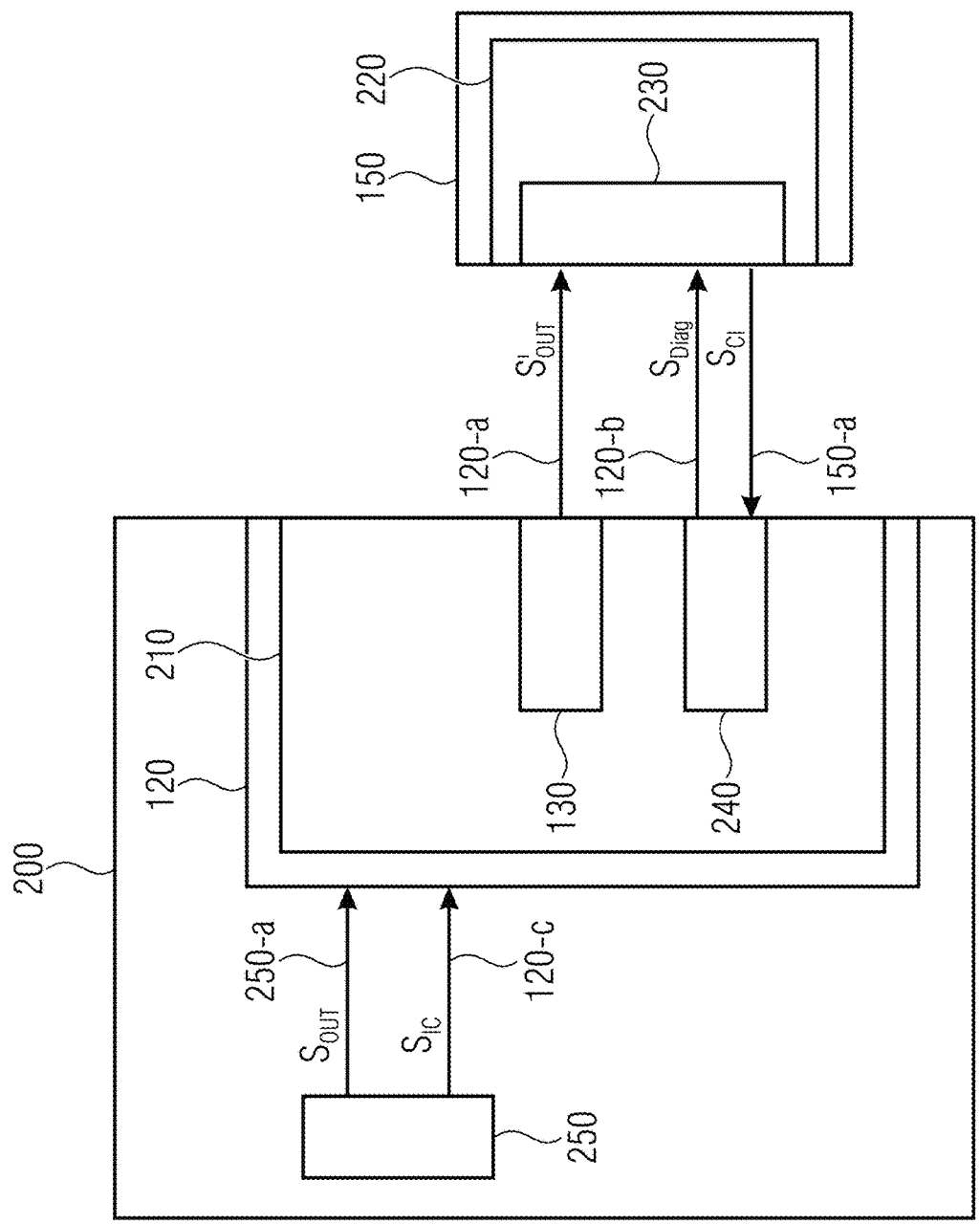
FIG. 2 shows a schematic view of a MEMS device, wherein the integrated circuitry comprises an ASIC and wherein the ASIC comprises a bidirectional second integrated interface according to an embodiment of the disclosure.

FIG. 2 shows a schematic view of a MEMS device 200 which is a further implementation of device 100, according to a further embodiment. In contrast to device 100, the integrated circuitry 120 comprises an ASIC 210 and the ASIC 210 comprises a second integrated interface, which is a bidirectional integrated interface 240. Furthermore, the MEMS microphone may be a digital or analog output MEMS microphone 250, wherein the ASIC 210 comprises optionally the first integrated interface 130. Moreover, the external processing device 150 comprises a CODEC 220, that comprises an interface 230. Interface 230 of the CODEC 220 is coupled with the integrated interfaces 130, 240 of the MEMS device 200. Optionally, the integrated circuitry 120 may be an ASIC 210 and the external processing 150 device may be a CODEC 220. In addition, the CODEC 220 of the external processing device may comprise more than one, for example two interfaces 230, each of them dedicated to one of the interfaces 130, 240 of the MEMS device 200.

In addition to the functionality explained in FIG. 1, the bidirectional second integrated interface 240 may receive a control information $S_{CI}$ 150-a from the external processing device 150 or CODEC 220. Control information $S_{CI}$ 150-a may be used for example to adjust performance parameters of the MEMS device 200, or may be used to trigger the determination of the diagnostic data $S_{Diag}$ 120-b. Furthermore, integrated circuitry 120, or for example the ASIC 210, may provide a signal $S_{IC}$ 120-c to the microphone 250. Providing such a signal $S_{IC}$ 120-c is not limited to the usage of digital output MEMS microphones, but to any microphone, e.g. analog output microphones, suitable for device 200. Signal $S_{IC}$ 120-c may be a test stimulus in order to determine the diagnostic data $S_{Diag}$ 120-b, for example to trigger a resonance test, and/or to compare the output signal Sour 250-a, based on the stimulus $S_{IC}$ to a reference signal or reference value. Signal $S_{IC}$ 120-c may be triggered by the control information $S_{CI}$ 150-a, for example, to adjust microphone parameters, or may be provided autonomously by the integrated circuitry 120 or the ASIC 210, for example in order to run self-tests in certain time intervals.

The MEMS device 200 shows an example of the integration of the bidirectional second integrated interface 240 and its functionality. ASICs may be cost efficient elements, providing the basic functionality of a MEMS microphone 110, e.g. as an audio transducer. Integration of the bidirectional second integrated interface 240 in an ASIC 220 may enable the integration of functionality according to the disclosure, such as determination of diagnostic data $S_{Diag}$ 120-b, for example in order to self-diagnose and providing such data, for example to communicate the status or current condition of the MEMS device 200, in existing concepts. Using the ASIC synergistically, e.g. by providing basic microphone functionality such as reading out and providing output signal $S_{OUT}$ 250-a, in addition to the determination of diagnostic data $S_{Diag}$ 120-b, may reduce costs, enable integration with low effort, and reduce wiring effort. By usage of the bidirectional second integrated interface 240, receiving control information Sc 150-a from the external processing device may enable real-time device optimization, for example, with respect to damage, that may be reported via $S_{Diag}$ 120-b, or changed environmental conditions.

In the following, an example of a MEMS leakage detection, for example the detection of a voltage leakage of the adaptive MEMS device is explained with FIGS. 3 and 4.

Figure 3:
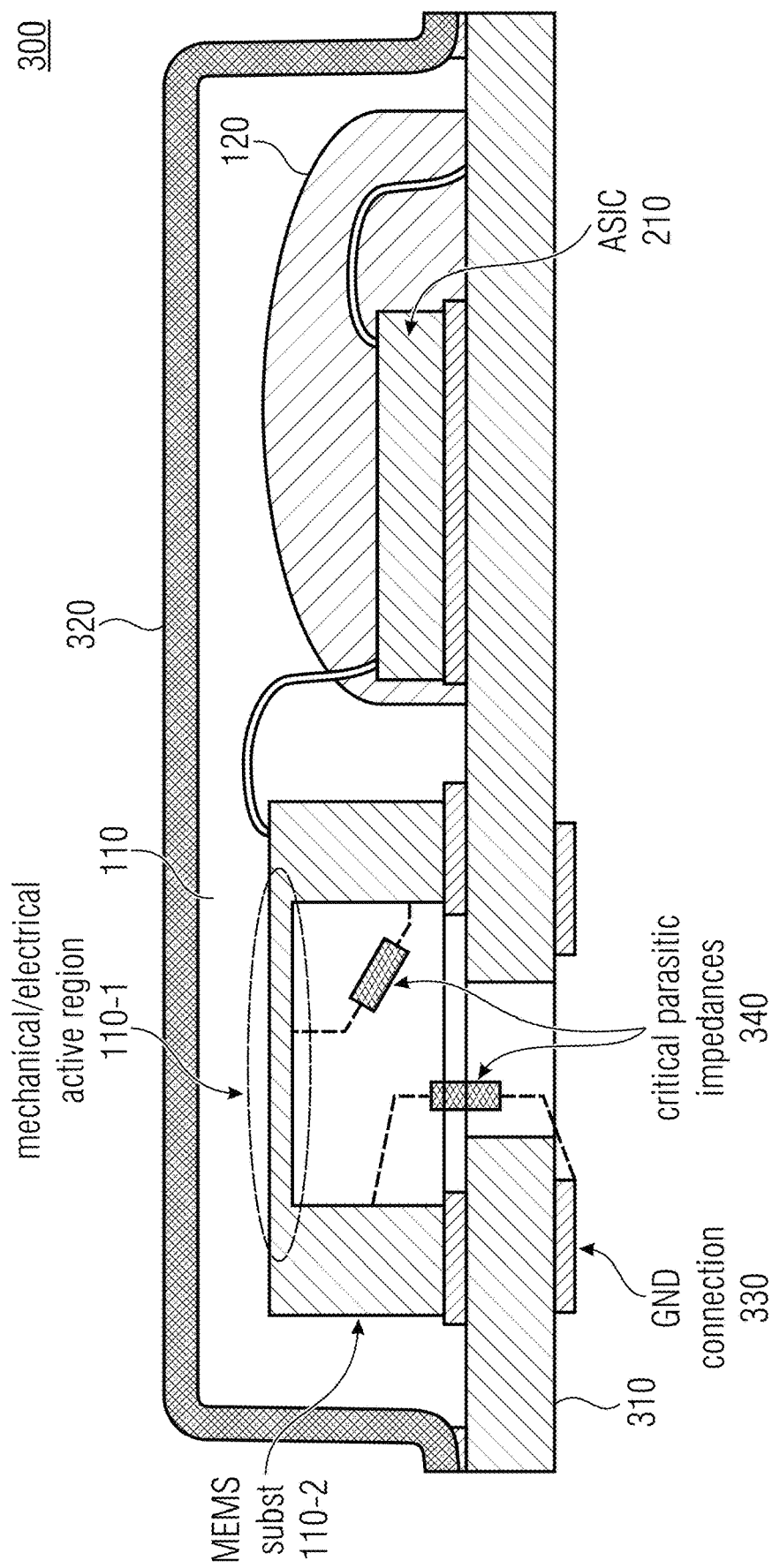
FIG. 3 shows a schematic view of a MEMS device with parasitic impedances which can be detected according to embodiments of the disclosure.

FIG. 3 shows a schematic view of a MEMS device with parasitic impedances which can be detected according to embodiments of the disclosure. FIG. 3 shows a MEMS device 300 with integrated circuitry 120 comprising an ASIC 210, that is electrically connected to a MEMS microphone 110 and a device substrate 310. The MEMS microphone 110 is shown in detail, comprising a mechanical/ electrical active region 110-1, for example, a membrane or dual backplate membrane and a MEMS substrate 110-2 (MEMS subst). Moreover, microphone 110 and integrated circuitry 120 are arranged on the device substrate 310 within a housing 320. In addition, critical parasitic impedances 340 are shown between the mechanical/electrical active region 110-1 and the MEMS substrate 310 and between the MEMS substrate 310 and a ground (GND) connection 330. For simplification, a first and second integrated interface are not shown in FIG. 3.

An environmental impact such as dust and water may cause an electrical (resistive) leakage between electrodes of the MEMS device 300, for example MEMS sensor. The electrical leakage may cause the critical parasitic impedances 340.

Figure 4:
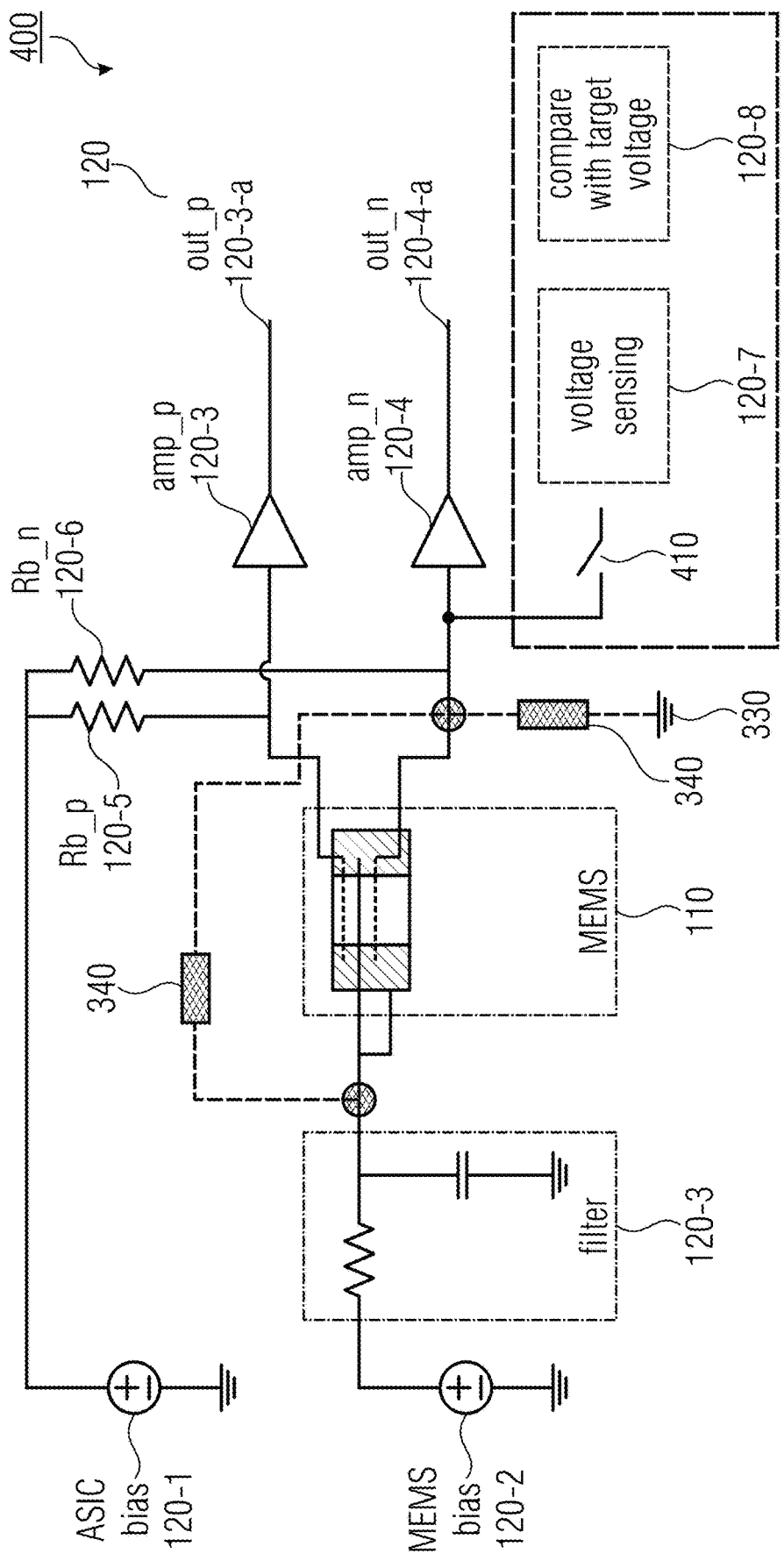
FIG. 4 shows a schematic circuit diagram of a MEMS device with parasitic impedances which can be detected according to embodiments of the disclosure.

FIG. 4 shows a schematic circuit diagram of a MEMS device 400 with parasitic impedances 340 which can be detected according to embodiments of the disclosure. FIG. 4 may show the schematic circuit diagram of the MEMS device 300 of FIG. 3, e.g. for implementing a leakage test feature according to the disclosure. The MEMS device 400 comprises an integrated circuitry 120, the integrated circuitry 120 comprising two voltage sources, an ASIC bias source 120-1 (ASIC bias), providing a bias voltage for the integrated circuitry 120 and a MEMS bias source 120-2 (MEMS bias), providing a bias voltage for a MEMS microphone no (MEMS). Between the MEMS bias voltage source 120-2 (MEMS bias) and the MEMS microphone no, an RC filter 120-3 (filter) is arranged which is also part of the integrated circuitry 120. As shown, the MEMS microphone no may be optionally configured as a dual backplate microphone. Each of the two backplates of the MEMS microphone is electrically connected to an amplifier 120-3, 120-4 (amp_p, amp_n) of the integrated circuitry 120. Each of the inputs of the amplifiers is electrically coupled with the ASIC bias source 120-1 via a resistor, Rb_p 120-5 and Rb_n

120-6. The amplifiers 120-3, 120-4 provide rendered output signals out_p 120-3-a and out_n 120-4-a. The signal of the backplate that is in contact with the environment is routed to the amplifier amp_n 120-4, the signal of the second backplate, that may be facing towards a housing of the device, for example housing 320 as shown in FIG. 3, to the amplifier amp_p 120-3. As an example, parasitic leakages 340 are shown as an example between the RC filter 120-3 and MEMS microphone 110 and the input of the amplifier amp_n 120-4 and between the input of the amplifier amp_n 120-4 and ground 330. Other arrangements of parasitic impedances are also possible, yet damage or leakage may be more probable at the backplate of the microphone 110 that is facing the environment. The integrated circuitry 120 comprises additional blocks (Voltage sensing 120-7 and Compare with target voltage 120-8) that are connected to the input of the amplifier amp_n 120-4 via a switch 410.

In the presence of leakage, an output signal, e.g., the input voltage of the amplifier amp_n 120-4 may be pulled away or deviate from its nominal value. In order to detect the leakage, the integrated circuitry 120 may determine diagnostic data by voltage sensing (Block 210-7) and comparing the sensed voltage, for example the sensed input voltage, with a target voltage (Block 120-8). As shown by the switch 410, the voltage at the amplifier may be sensed on demand, for example in an analysis mode, and may be compared to a reference value, e.g. the nominal voltage, for example the voltage at the time of production. In case the deviation is larger than a predefined value or reference value or reference signal a 'leakage preset' bit may be set. Furthermore, a voltage-deviation to leakage-impedance lookup-table may be implemented to give more precise information about the level of leakage. Instead or in addition of a comparison to a reference value, e.g. a predefined value the difference of the voltages of amplifier amp_p 120-3 and amplifier amp_n 120-4 may be used. Further information may be gathered if the MEMS bias voltage is measured and stored.

Figure 5:
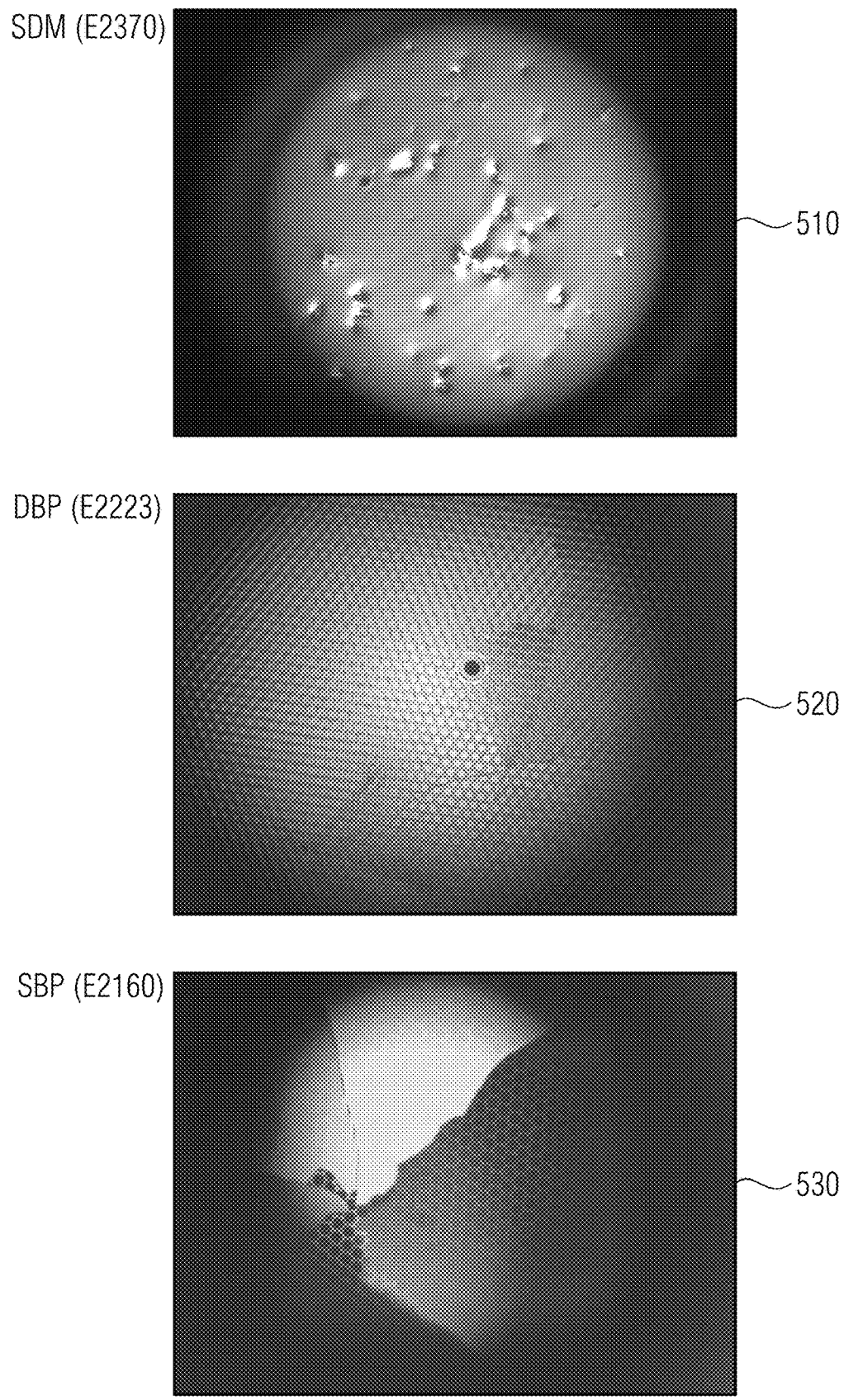
FIG. 5 shows pictures of damaged microphone membranes which can be detected/tested according to an embodiment of the disclosure.

FIG. 5 shows pictures of damaged microphone membranes which can be detected/tested according to an embodiment of the disclosure. Mechanically damaged microphone membranes can be a common failure mechanism that appears in the field. FIG. 5 shows a damaged sealed dual membrane microphone 510 (e.g., having puncture damages by particles), a damaged dual backplate microphone 520 (having cracks or micro cracks) and a damaged single backplate microphone 530 (with broken off parts—destructed).

Figure 6:
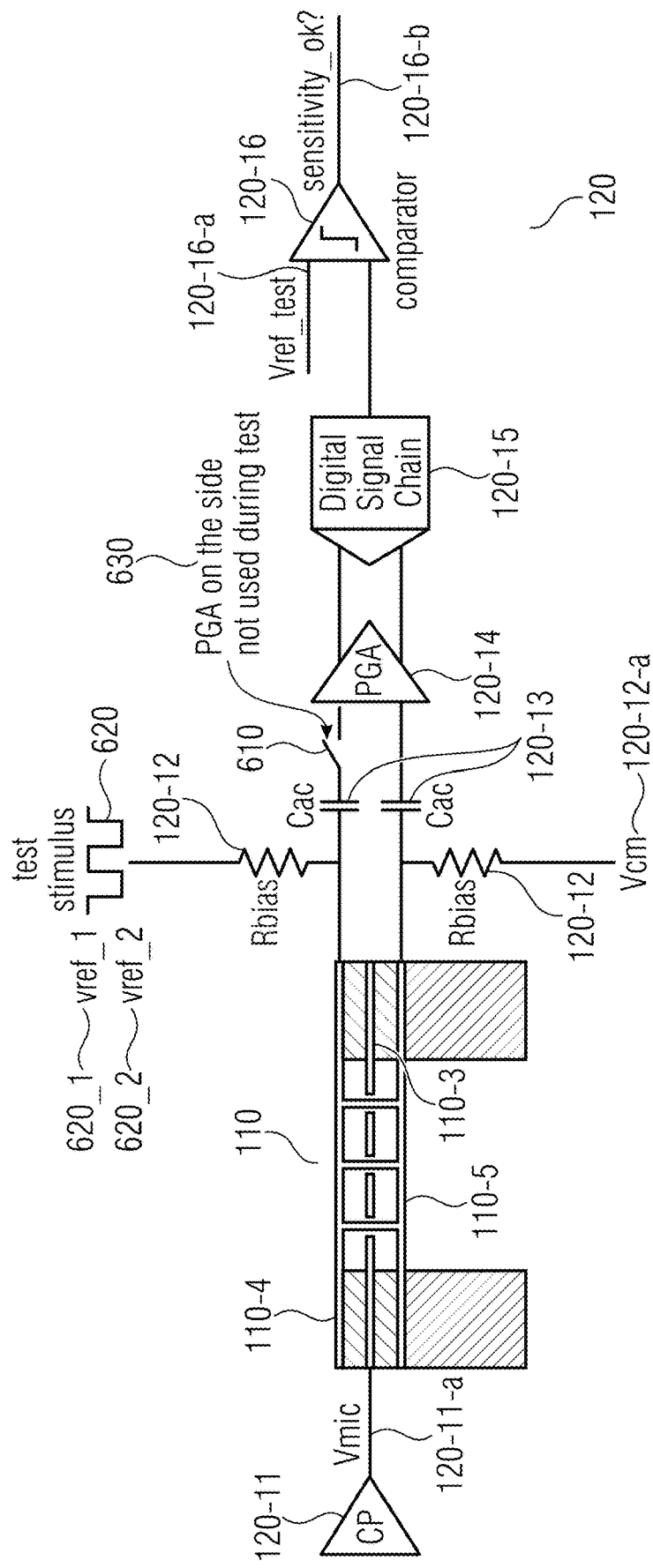
FIG. 6 shows a schematic view of a MEMS device being tested with a first test stimulus according to an embodiment of the disclosure.
Figure 7:
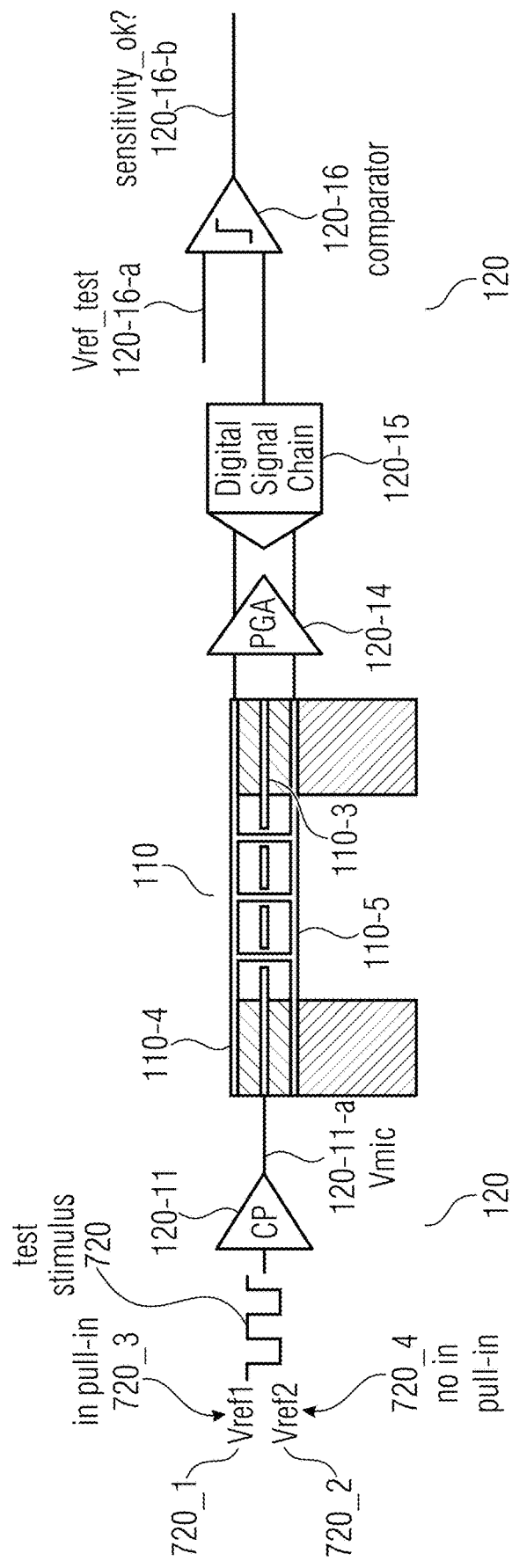
FIG. 7 shows a schematic view of a MEMS device being tested with a second test stimulus according to an embodiment of the disclosure.

As explained with the following FIGS. 6 and 7 an on-chip self-test according to the disclosure may allow an e.g., simple electrical test to check the sensitivity, for example, of the microphone or its membrane in order to detect membrane damage, for example damage shown in FIG. 5. Such a test may be provided to a customer as a feature, for example an additional feature of the MEMS device. In addition, the concepts explained with FIGS. 6 and 7 may provide a microphone self-test for damaged membrane detection and/or complete signal chain check, wherein the signal chain may comprise at least one of the MEMS device, the MEMS microphone and the integrated circuitry, e.g. comprising the ASIC and in this case optionally the ASIC itself. Embodiments of the disclosure may comprise a signal path sensitivity check, for example in order to detect a broken membrane.

FIG. 6 shows a schematic view of a MEMS device being tested with a first test stimulus according to an embodiment of the disclosure. FIG. 6 may show a possible implementation for a signal chain check.

FIG. 6 shows integrated circuitry 120 comprising a voltage source CP 120-11, two resistors Rbias 120-12 and two capacitors Cac 120-13. The integrated circuitry further comprises a programmable gain amplifier (PGA) 120-14, a switch 610, means for the processing of a Digital Signal Chain 120-15, e.g. digital logic, and a comparator 120-16. The voltage source CP 120-11 is coupled to the stator 110-3 of a microphone 110. The microphone 110 is optionally a sealed dual membrane (SDM) microphone. Each of the membranes 110-4, 110-5 of the microphone 110 is coupled with one of the resistors Rbias 120-12 and one of the capacitors Cac 120-13. Each membrane 110-4, 110-5 is coupled with the PGA 120-14 via its corresponding capacitor Cac 120-13. Electric coupling of the membrane 110-4 with the PGA 120-14 is interrupted by the switch 610. The two outputs of the PGA 120-14 are coupled with the means for the processing of the Digital Signal Chain 120-15 (In the following for simplification Digital Signal Chain). The output of the Digital Signal Chain 120-15 is coupled with the comparator 120-16, wherein a second input of the comparator is a voltage 120-16-a (Vref_test). Furthermore, a voltage 120-12-a (Vcm) is applied to the Rbias 120-12 on the uninterrupted side of the electrical signal chain.

The voltage source CP 120-11 provides a supply voltage 120-11-a (Vmic) to the stator 110-3 of the microphone, e.g. via its corresponding Rbias 120-12. In order to determine the diagnostic data, a test stimulus 620 is applied to the membrane 110-4. Because of the switch 610, the corresponding side of the PGA is not used during this test 630. The test stimulus 620 may be an alternating, rectangular signal as shown in FIG. 6, comprising two voltage levels 620-1 (vref_1) and 620-2 (vref_2). By applying the stimulus 620 to the membrane 110-4, an oscillation is induced. Because of the coupling of the membranes an electric resulting response signal is generated in the uninterrupted electrical signal chain of membrane 110-5. This signal is then amplified by the PGA 120-14, digitized in the Digital Signal Chain 120-15 and evaluated in the comparator 120-16. Evaluation comprises comparing the signal to the reference voltage 120-16-a (Vref_test). The result of the comparison is an indicator for the sensitivity 120-16-b of the microphone 110 and hence comprises diagnostic information, for example an information on a damaged membrane in case of a sensitivity that is not within a nominal interval. Furthermore, the result of the comparison may allow detection of damage in the integrated circuitry 120 as well, since the signal to be compared is routed through the circuitry 120.

In other words, in order to check the signal chain, one side of the PGA 120-14 may be varied common mode to drive the MEMS, for example the MEMS device or MEMS microphone 110, with a defined test stimulus 620 to move the membrane 110-4. For example, the integrated circuitry 120, may then detect on the other side of the PGA 120-14, e.g. a resulting response signal, to see if a defined sensitivity exists. Checking the sensitivity 120-16-b may be performed by the comparator 210-16 by comparing the resulting response signal, for example a voltage, to a target response signal or a reference response signal 120-16-a, for example Vref_test. The Vref_test may be a predefined expected MEMS response, which is compared to the test signal, e.g. test stimulus 620 to determine if a fault exists and may be set either based on design or may need to be calibrated during production. The check may be done at any point in the signal chain, but if placed at the end, this may test for any damage in the integrated circuitry signal chain or ASIC signal chain as well. Therefore, the e.g. entire signal chain from MEMS, for example the MEMS microphone 110 to the integrated circuitry 120 or ASIC may be checked. This method may be applied to microphones with dual plates or membranes, in order to exploit the signal path between the dual plates or membranes for diagnosis or determination of diagnostic data.

FIG. 7 shows a schematic view of a MEMS device being tested with a second test stimulus according to an embodiment of the disclosure. FIG. 7 may show a possible implementation of a pull-in stimulation.

In comparison to FIG. 6 the test stimulus 720 is done on the Vmic node 120-11 (CP), e.g. by applying the stimulus 720 to the supply voltage Vmic 120-11-*a*. Therefore, membrane movement may be achieved by going in between pull in 720-3 (In pull-in) and pull out 720-4 (No in pull-in), for example by two distinct voltage levels 720-1 vref_1 and 720-2 vref_2 of the test stimulus 720. This method may also be applicable to single backplate microphones. Additional circuitry, e.g. resistors and capacitors as shown in FIG. 6 may be present, but are not shown for simplification.

In the following, with FIGS. 8 and 9 further embodiments of the disclosure are explained, which may be used for microphone self-tests for damaged SDM membrane detection.

Figure 8:
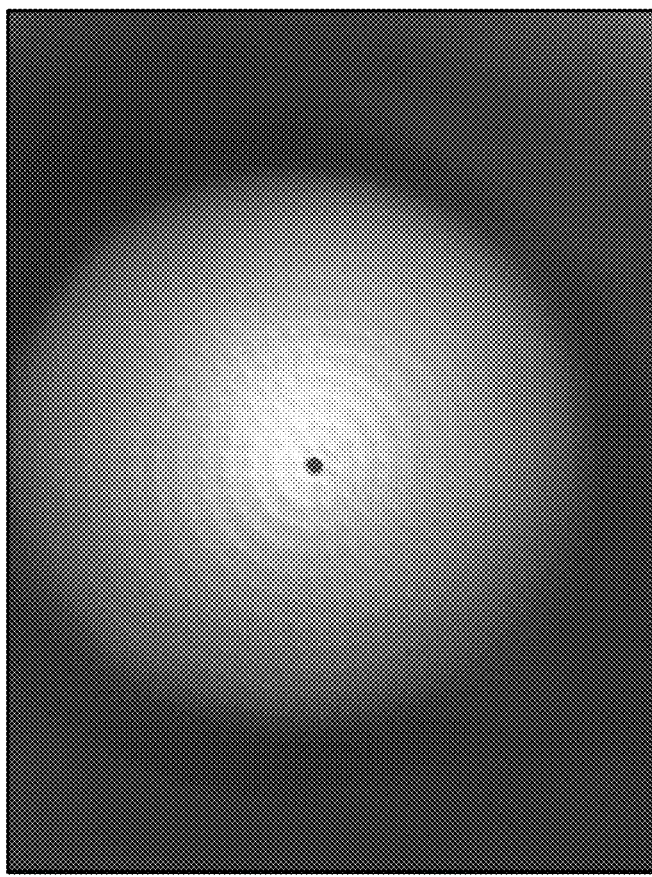
FIG. 8 shows pictures of an undamaged SDM MEMS microphone and a damaged SDM MEMS microphone.
Figure 8:
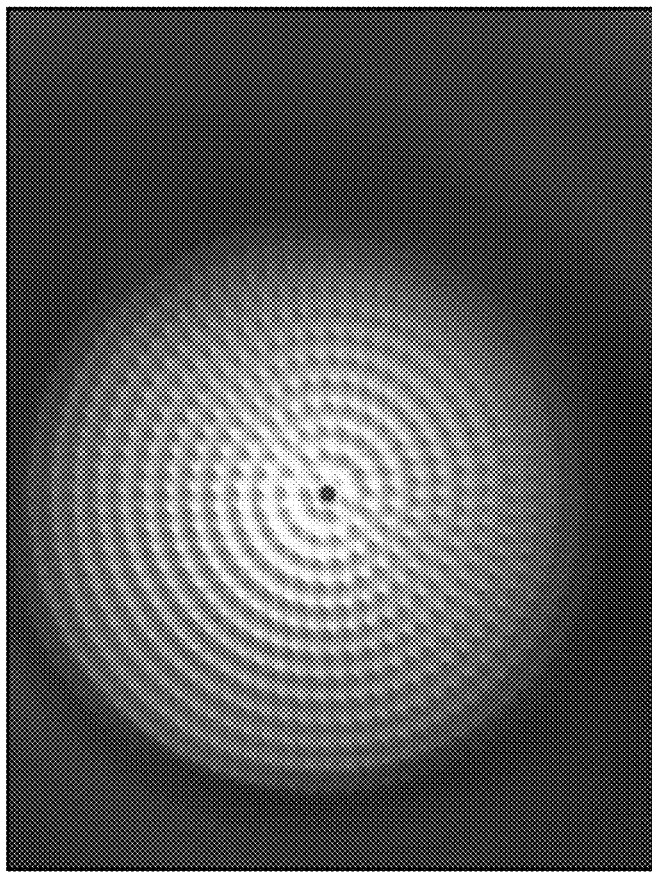

FIG. 8 shows pictures of an undamaged SDM MEMS microphone 810 and a damaged SDM MEMS microphone 820. In case of a damaged membrane, the loss of vacuum, e.g. via a very small crack, leading to a certain air pressure may cause a change (=flattening) of a curved surface contour of the membrane. Microphones with SDM may form a special case, for example, with respect to damage detection. There may be cases wherein the membrane is only lightly damaged (e.g., microcracks). This may be an issue for SDM as it may result in vacuum loss, causing an increase in noise with no drop in sensitivity, and hence a SNR (signal-to-noise ratio) loss. A sensitivity self-check alone, as proposed previously, may overlook this damage. Therefore, in the following a self-test to identify vacuum loss according to an aspect of the disclosure is presented, as a further development of the concepts explained so far. This may be very useful for SDM products as it may catch a plurality or for example even all membrane damages from small to large. In addition, the following embodiment of the disclosure may be used for SDM vacuum loss detection.

Figure 9:
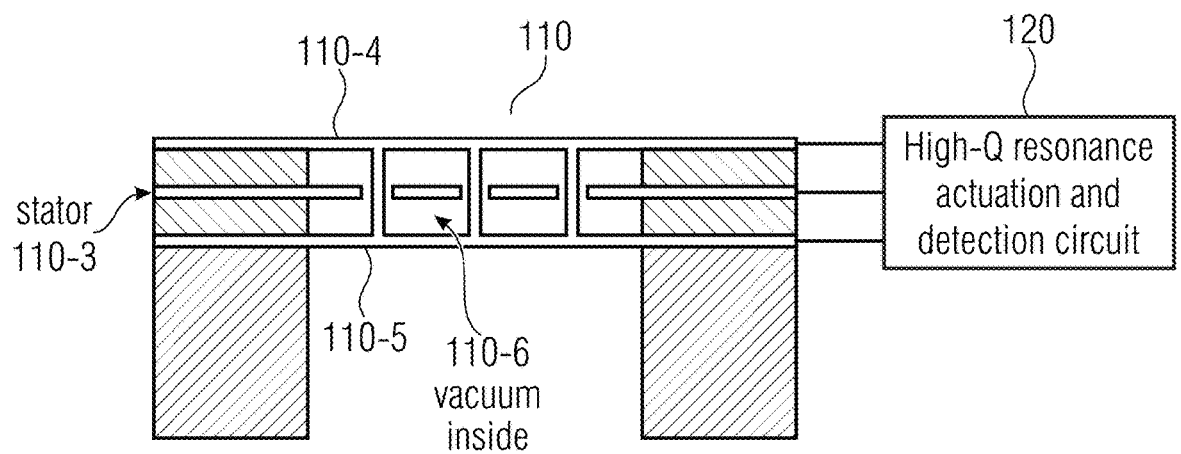
FIG. 9 shows a schematic view of a MEMS device with a SDM MEMS microphone according to an embodiment of the disclosure.

FIG. 9 shows a schematic view of a MEMS device with a SDM MEMS microphone according to an embodiment of the disclosure. FIG. 9 shows a MEMS microphone 110 comprising a stator 110-3 in between two membranes 110-4, 110-5, with a vacuum 110-6, for example in the technical sense, between the membranes 110-4, 110-5. The integrated circuitry 120 comprises a High-Q resonance actuation and detection circuit. For simplification, first and second integrated interface are not shown in FIG. 9.

In an undamaged part or MEMS device, the SDM may hold a vacuum and thus the embedded electrode (stator 110-3) may resonate when connected to a resonator circuit. If the membrane (e.g., 110-4 or 110-5) of the SDM is in any way punctured (for example, broken membrane or even just a small micro-crack), the vacuum inside (110-6) may be lost and, for example, the stator 110-3, may cease (stop) to resonate. The self-test is to use the integrated circuitry 120 comprising a test circuit to trigger the resonance of the stator 110-3 and if the vacuum 110-6 is present, the stator 110-3 may resonate and the test may pass. The vacuum 110-6 may enable a high Q (quality, or Q factor) of the oscillation because of the reduced damping of the membrane. Damage leading to gas inside the microphone 110 may result in a low Q of the oscillation because of damping and resonance shift. Therefore, detection of quality of the oscillation may enable detection of membrane damage.

In other words, embodiments of the disclosure may use high Q of vacuum for self-tests. In vacuum 110-6, the oscillation of the stator 110-3 may be undamped or at least approximately undamped, for example in comparison to an oscillation in an environment with a certain pressure, as it may be the case when the membrane (e.g., 110-4 or 110-5) is damaged. This may lead to a resonance shift that can be detected for example by the integrated circuitry 120. Furthermore, resonance may be set up by the charge pump. This may be triggered by control information received via a second integrated interface 140. Resonance frequencies of devices according to aspects of the disclosure may be configured to be outside working area frequencies of signals to be detected or emitted. Determination of diagnostic data as explained above may be able to detect small and big cracks of membranes.

Figure 10:
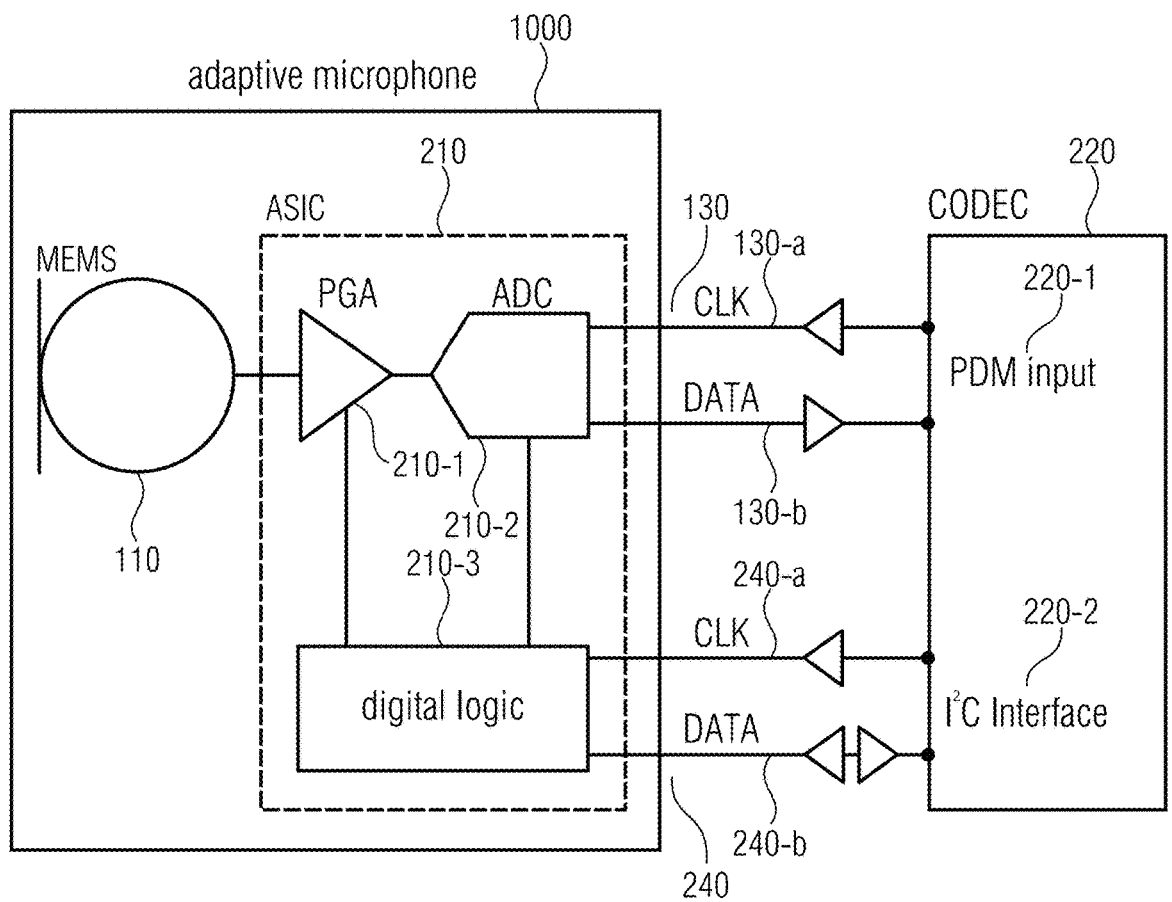
FIG. 10 shows a schematic view of a MEMS device, as an example in the form of an adaptive microphone, according to an embodiment of the disclosure.

FIG. 10 shows a schematic view of a MEMS device 1000, as an example in the form of an adaptive microphone, according to an embodiment of the disclosure. The MEMS device comprises a MEMS microphone 110 (MEMS) and integrated circuitry in the form of an ASIC 210, wherein the ASIC comprises a programmable gain amplifier (PGA) 210-1, an analog-digital converter (ADC) 210-2, digital logic 210-3, a first integrated interface 130 and a second integrated interface, which is a bidirectional second integrated interface 240. An external processing device is shown, wherein the external processing device is a CODEC 220, the CODEC 220 comprising a PDM (pulse density modulation) input 220-1 that is coupled with a first integrated interface 130 and a I²C interface 220-2 that is coupled with the second bidirectional integrated interface 240 . . . . The first integrated interface 130 receives a clock signal 130-*a* (CLK) from the PDM input 220-1 and provides a data signal 130-*b* to the PDM input 220-1. The second bidirectional integrated interface 240 receives a clock signal 240-*a* (CLK) from the I²C Interface 220-2 and performs bidirectional exchange of data 240-*b* (DATA) to and from the I²C Interface 220-2.

In comparison to a standard digital microphone some functionality may be, for example easily, added to the e.g., digital ASIC 210, according to aspects of the disclosure, to enable run-time control and diagnostics. Functionality useful for run-time diagnostics may comprise at least one of detecting particles on MEMS, e.g. to flag before final system FAPT (Final Assembly Test and Packing, for example, the last stage in production of a device such as a smartphone), detecting overload of ADC/PGA to enable soft reset, detecting/releasing MEMS pull-in, resetting charge pump and reducing PDM output slew rate.

The adaptive microphone 1000 shown in FIG. 10 may offer a broad amount of functionality. Microphones or devices according to embodiments of the disclosure may enable access to internal registers of e.g. digital ASICs 210 or to control run-time parameters. Therefore, they may not be limited to data generation only, for example such as common MEMS microphones, but also to receive signals, such as control information. The adaptive microphone 1000 may enable calibration and/or access to test registers that is not only set and forget but adjustable, e.g. in run-time or adaptively, for example via control information.

Furthermore, an existing calibration interface present in digital, e.g. standard, microphones allows, for example only, access to control registers during microphone start-up, used during calibration of the microphone. This interface is not enabled to be used during run-time in the field, for example in comparison to the second bidirectional integrated interface 240 that may be used to adjust performance parameters of the device 1000 at run-time.

Digital or analog microphones according to embodiments of the disclosure may comprise a control interface, for example configured to determine and/or provide diagnostic data. Microphones according to embodiments of the disclose may provide additional functionality, for example, in addition to switching operating modes dependent on the PDM clock frequency applied, such as determination of diagnostic data or adjustment of control parameters.

Figure 11:
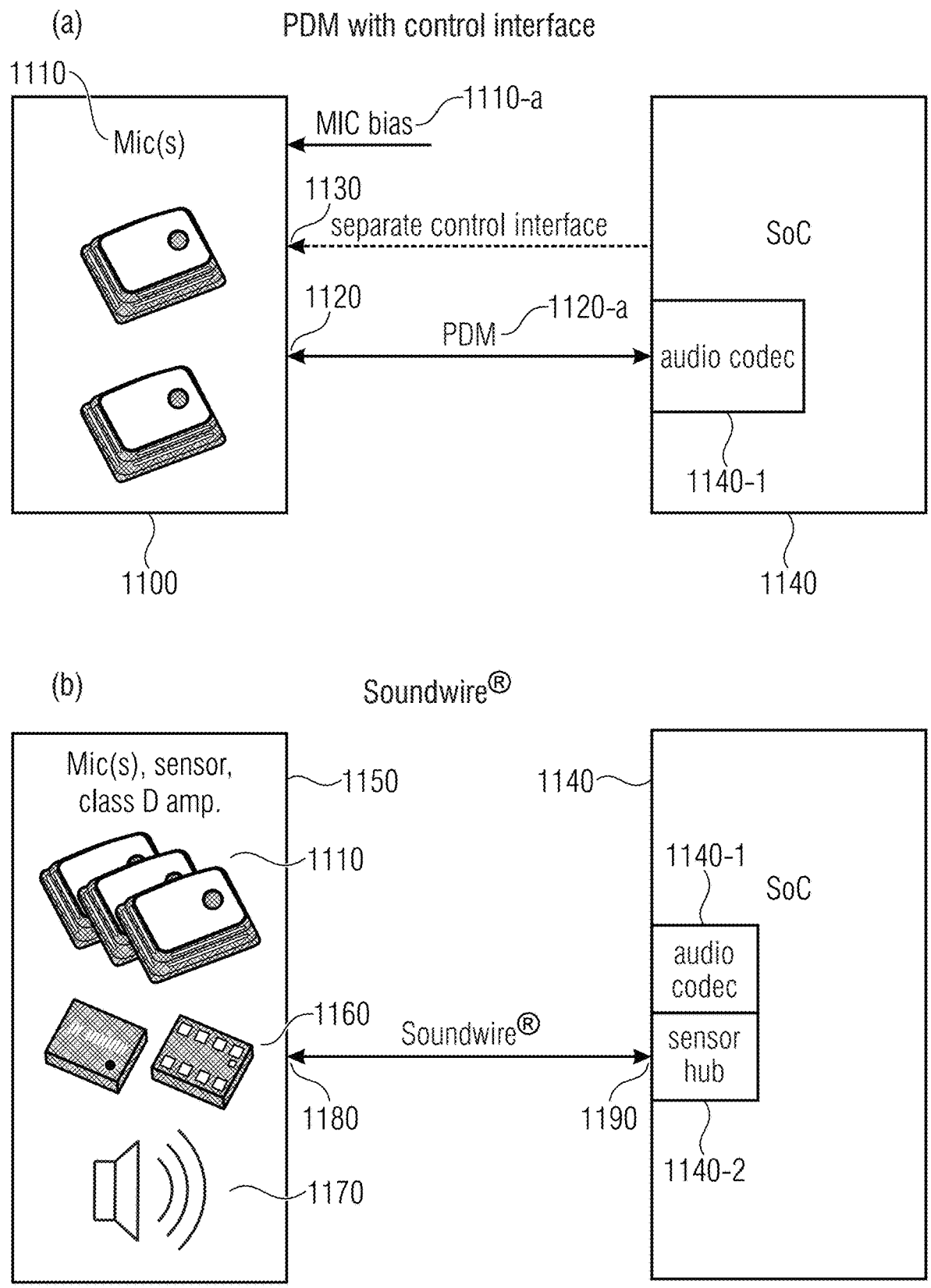
FIG. 11 shows possible implementations of second integrated interfaces according to aspects of the disclosure.

FIG. 11 shows possible implementations of second integrated interfaces according to aspects of the disclosure.

Box (a) shows an embodiment of the disclosure with PDM with control interface. The device comprises one or more microphones 110 (Mic(s)) and may receive microphone biases 110-a (Mic bias). The device comprises an interface 1120 for the PDM, for example the first integrated interface and a separate control interface 1130, for example, the second integrated interface. In this example, a system on chip (SoC) 1140 comprises an audio codec 1140-1 and the separate control interface 1130 provides a unidirectional signal line from the system on chip 1140 to the device 1100, for example, to receive control information. Furthermore, the PDM signal line 1120-a is arranged between the device 1100 and the audio codec 1140-1 and is bidirectional. For simplification, integrated circuitry is not shown explicitly, but may be present in device 1100.

Box (b) shows a second embodiment of the disclosure wherein the device 1150 comprises one or more microphones 110 (Mic(s)), a sensor 1160 and a class-D amplifier 1170. Sensor 1160 and amplifier 1170 may be part of an integrated circuitry of device 1150. A system-on-a-chip 1140 comprises an audio codec 1140-1 and a sensor hub 1140-2. The device 1150 and the sensor hub 1140-2 comprise bidirectional Soundwire® interfaces 1180, 1190, enabling bidirectional communication between the two. The Soundwire® interface 1180 may be an example for a combined first and second integrated interface, providing the functionality of both.

Future setups, for example setups according to aspects of the disclosure, e.g. as shown in box (a) and/or (b) can make bidirectional interfaces possible, enable adjustment of microphone performance parameters in run-time and/or enable run-time diagnostics and adjustment of functionality.

Such setups may comprise advantages such as that Mic or microphone mode programming is possible in a wider functional range, EME (Electromagnetic Energy) problems with digital IF, e.g. Interfaces (e.g., because of voltages of PDM 1.8V) may be reduced, EMI (Electro-Magnetic-Interference) problems with analog IF (single ended, e.g. in case of single-ended signaling) may be reduced, and for example high power consumption for always on operations, for example because of too many ASICs involved may be diminished.

Figure 12:
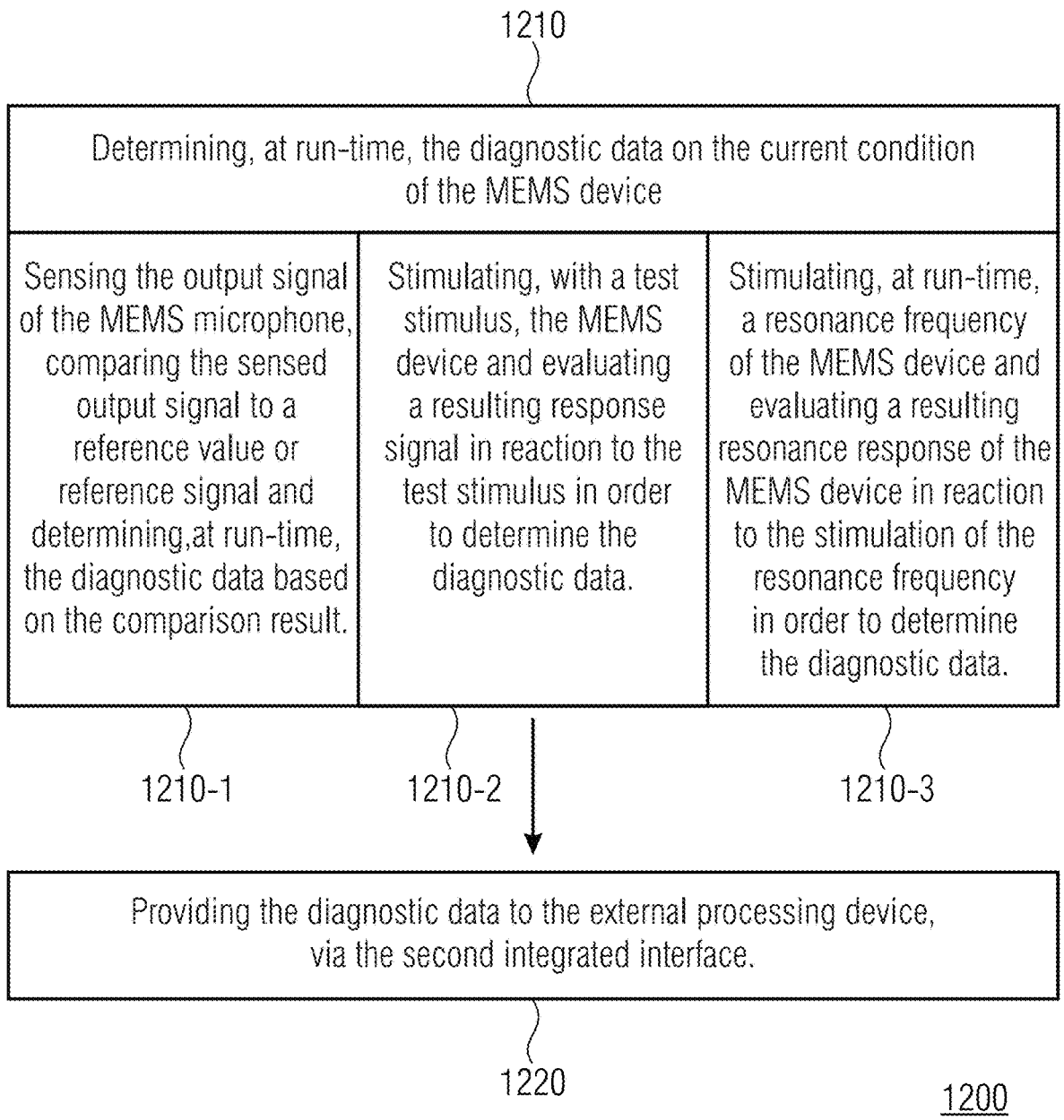
FIG. 12 shows a flowchart of a method for providing diagnostic data of a MEMS device, via a second integrated interface, to an external processing device according to aspects of the disclosure.

FIG. 12 shows a flowchart of a method 1200 for providing diagnostic data of a MEMS device, via a second integrated interface, to an external processing device according to aspects of the disclosure. Step 1210 comprises determining, at run-time, the diagnostic data on the current condition of the MEMS device. Step 1220 comprises providing the diagnostic data to the external processing device, via the second integrated interface. Furthermore, determining the diagnostic data of step 1210 may comprise one or more of substeps 1210-1, 1210-2 and 1210-3. Substep 1210-1 comprises sensing the output signal of the MEMS microphone, comparing the sensed output signal to a reference value or reference signal and determining, at run-time, the diagnostic data based on the comparison result. Substep 1210-2 comprises stimulating, with a test stimulus, the MEMS device and evaluating a resulting response signal in reaction to the test stimulus in order to determine the diagnostic data. Substep 1210-3 comprises stimulating, at run-time, a resonance frequency of the MEMS device and evaluating a resulting resonance response of the MEMS device in reaction to the stimulation of the resonance frequency in order to determine the diagnostic data.

Additional embodiments and aspects are described which may be used alone or in combination with the features and functionalities described herein.

In accordance to an aspect of the disclosure the second integrated interface comprises the first integrated interface and the integrated circuitry is configured to provide the output signal or a rendered output signal, via the second integrated interface, to the external processing device.

In accordance to an aspect of the disclosure the second integrated interface is a bidirectional integrated interface and the integrated circuitry is configured to receive, via the bidirectional interface, at run-time, a control information for setting an operation characteristic of the MEMS device from the external processing device.

In accordance to an aspect of the disclosure the integrated circuitry is configured to determine, at run-time, the diagnostic data based on the control information received, at run-time, via the bidirectional integrated interface from the external processing device.

In accordance to an aspect of the disclosure the integrated circuitry is configured to control an operating condition of the MEMS microphone based on the control information received, at run-time, via the bidirectional integrated interface, from the external processing device.

In accordance to an aspect of the disclosure the integrated circuitry comprises a memory and is configured to store the diagnostic data in the memory.

In accordance to an aspect of the disclosure the integrated circuitry is configured to sense the output signal of the MEMS microphone and to compare the sensed output signal to a reference value or reference signal. Consequently, the comparison result provides the diagnostic data.

In accordance to an aspect of the disclosure the diagnostic data comprises an information on a leakage impedance of the MEMS microphone.

In accordance to an aspect of the disclosure at least one of the MEMS microphone and the integrated circuitry are configured to be stimulated with a test stimulus and the integrated circuitry is configured to evaluate a resulting response signal in reaction to the test stimulus in order to determine the diagnostic data, or the integrated circuitry is configured to provide the resulting response signal, via the second integrated interface, to the external processing device.

In accordance to an aspect of the disclosure the integrated circuitry is configured to generate the test stimulus for the stimulation, or the integrated circuitry is configured to receive, via the second integrated interface, the test stimulus from the external processing device.

In accordance to an aspect of the disclosure the integrated circuitry is configured to stimulate, at run-time, a resonance frequency of the MEMS microphone. Furthermore, the integrated circuitry is configured to evaluate a resulting resonance response of the MEMS microphone in reaction to the stimulation of the resonance frequency in order to determine the diagnostic data. Alternatively, the integrated circuitry may be configured to provide the resulting resonance response of the MEMS microphone in reaction to the stimulation of the resonance frequency, via the second integrated interface, to the external processing device.

In accordance to an aspect of the disclosure the MEMS microphone is a digital or analog output MEMS microphone.

In accordance to an aspect of the disclosure the integrated circuitry comprises an ASIC and the ASIC comprises the second integrated interface.

Embodiments of the disclosure comprise a CODEC for use with the MEMS device explained before, wherein the external processing device comprises the CODEC and wherein the CODEC comprises an interface for communication. Furthermore, the CODEC is configured to perform at least one of providing, at run-time, a control information via the interface for the MEMS-device and receiving, at run-time, diagnostic data on the current condition of the MEMS device, via the interface, from the MEMS device.

Embodiments of the disclosure comprise a method for providing diagnostic data, at run-time, on the current condition of the MEMS device explained before, via the second integrated interface, to the external processing device. The method comprises determining, at run-time, the diagnostic data on the current condition of the MEMS device and providing the diagnostic data to the external processing device, via the second integrated interface.

In accordance to an aspect of the disclosure determining, at run-time, the diagnostic data comprises at least one of:
  sensing the output signal of the MEMS microphone, comparing the sensed output signal to a reference value or reference signal and determining, at run-time, the diagnostic data based on the comparison result and
  stimulating, with a test stimulus, the MEMS device and evaluating a resulting response signal in reaction to the test stimulus in order to determine the diagnostic data; and
  stimulating, at run-time, a resonance frequency of the MEMS device and evaluating a resulting resonance response of the MEMS device in reaction to the stimulation of the resonance frequency in order to determine the diagnostic data.

Embodiments of the disclosure comprise a computer readable digital storage medium having stored thereon, a computer program having a program code for performing, when running on a computer, any of the methods explained.

CONCLUSIONS AND FINAL REMARKS

Embodiments of the disclosure comprise a MEMS microphone with an integrated control interface, for example the second integrated interface, e.g. implemented through I²C, SPI, GPIO, Soundwire®, or similar. This interface can be unidirectional or bidirectional. A unidirectional interface may allow only the transmission of command information or control information or diagnostic information, a bidirectional interface may allow for transmission and receipt of information. The interface, for example, the second integrated interface, can be used to control microphone performance parameters, including but not limited to, analog or digital gain settings, filter settings, sensitivity level. The interface can also be used to detect diagnostic information including, but not limited to, high leakage current at ASIC input, Amplifier overload, ADC overload, status information of various ASIC blocks including Charge Pump, ADC, LDO (Low Drop-Out, e.g. Low Drop-Out controller), Calibration Memory. A microphone with such an interface can be used in multiple customer projects which have different requirements, whereas current microphones may be individually calibrated for each project, introducing logistical and inventory management difficulty.

Embodiments of the disclosure may comprise bare dies or bare-die components, which may comprise separate ASIC and MEMS dies, that may be assembled into a microphone "module", for example, including the two dies, a PCB (e.g., Printed Circuit Board) substrate and a (e.g., typically) metal lid. In other words, the bare dies or bare-die components may be configured to be integrated into a module.

Embodiments of the disclosure may allow a customer of the microphones, e.g. MEMS microphone or MEMS device according to aspects of the disclosure to use the full dynamic range of the MEMS, allowing for higher performance of the microphone in their system, e.g. when compared with a similarly sized and priced competitor product. Embodiments of the disclosure may allow customers to use the same basic microphone in multiple projects, with different settings applied during run-time, simplifying their logistics and inventory management. Microphone performance customization may allow for much better control of the microphone performance in multiple projects in customers and may allow for greater sales numbers with fewer products and less support from the manufacturer.

In accordance to an aspect of the disclosure the second integrated interface may be configured to read out status information and information of diagnostic registers. This may also be achievable by expanding the ADC (analog to digital converter) dynamic range to match that of the MEMS, e.g. MEMS device or MEMS microphone. It may be possible to adjust gain settings without including an interface. In comparison to the use of the second integrated interface according to aspects of the disclosure, this may require a large and high power ASIC, which would be cost prohibitive and too power intensive for high volume MEMS microphone projects such as smartphones. In other words, the use of a second integrated interface according to embodiments of the disclosure may increase efficiency for high volume products, for example by reducing costs and power consumption.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the disclosure can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the disclosure comprise a data carrier having electronically readable control signals, which are capable of cooperating with a programmable computer system, such that one of the methods described herein is performed.

Generally, embodiments of the disclosure can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the method of the disclosure is, therefore, a computer program having a program code for performing one of the methods described herein, when the computer program runs on a computer.

A further embodiment of the methods of the disclosure is, therefore, a data carrier (or a digital storage medium, or a computer-readable medium) comprising, recorded thereon, the computer program for performing one of the methods described herein.

A further embodiment of the method of the disclosure is, therefore, a data stream or a sequence of signals representing the computer program for performing one of the methods described herein. The data stream or the sequence of signals may for example be configured to be transferred via a data communication connection, for example, via the Internet.

A further embodiment comprises a processor, for example a computer, or a programmable logic device, configured to or adapted to perform one of the methods described herein.

A further embodiment comprises a computer having installed thereon the computer program for performing one of the methods described herein.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of aspects of the disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. An adaptive microelectromechanical system (MEMS) device comprising:
a MEMS microphone; and
integrated circuitry, wherein the integrated circuitry is electrically connected to the MEMS microphone, and wherein the integrated circuitry is configured to:
read out a non-stimulated sensed output signal from the MEMS microphone;
provide the non-stimulated sensed output signal or a rendered version of the non-stimulated sensed output signal, via a first integrated interface, to an external processing device;
determine, at run-time, diagnostic data on a current condition of the MEMS device, by comparing the non-stimulated sensed output signal to a reference value or reference signal, thereby synergistically using the integrated circuitry to both read out the non-stimulated sensed output signal and determine the diagnostic data; and
provide, at run-time, the diagnostic data, via a second integrated interface, to the external processing device.

2. The MEMS device according to claim 1, wherein the second integrated interface comprises the first integrated interface; and
wherein the integrated circuitry is configured to provide the non-stimulated sensed output signal or the rendered version of the non-stimulated sensed output signal, via the second integrated interface, to the external processing device.

3. The MEMS device according to claim 1, wherein the second integrated interface is a bidirectional integrated interface, and wherein the integrated circuitry is configured to receive, via the bidirectional integrated interface, at run-time, a control information for setting an operation characteristic of the MEMS device from the external processing device.

4. The MEMS device according to claim 3, wherein the integrated circuitry is further configured to determine, at run-time, the diagnostic data based on the control information received, at run-time, via the bidirectional integrated interface from the external processing device.

5. The MEMS device according to claim 3, wherein the integrated circuitry is configured to control an operating condition of the MEMS microphone based on the control information received, at run-time, via the bidirectional integrated interface, from the external processing device.

6. The MEMS device according to claim 1, wherein the integrated circuitry comprises a memory, and wherein the integrated circuitry is configured to store the diagnostic data in the memory.

7. The MEMS device according to claim 1, wherein the diagnostic data comprises information on a leakage impedance of the MEMS microphone.

8. The MEMS device according to claim 1, wherein at least one of the MEMS microphone or the integrated circuitry is configured to be stimulated with a test stimulus, and wherein the integrated circuitry is configured to:
evaluate a resulting response signal in reaction to the test stimulus in order to determine the diagnostic data; or provide the resulting response signal, via the second integrated interface, to the external processing device.

9. The MEMS device according to claim 8, wherein the integrated circuitry is configured to generate the test stimulus for the stimulation, or wherein the integrated circuitry is configured to receive, via the second integrated interface, the test stimulus from the external processing device.

10. The MEMS device according to claim 1, wherein the integrated circuitry is configured to stimulate, at run-time, a resonance frequency of the MEMS microphone, and wherein the integrated circuitry is configured to:
evaluate a resulting resonance response of the MEMS microphone in reaction to the stimulation of the resonance frequency in order to determine the diagnostic data; or
provide the resulting resonance response of the MEMS microphone in reaction to the stimulation of the resonance frequency, via the second integrated interface, to the external processing device.

11. The MEMS device according to claim 1, wherein the MEMS microphone is a digital output MEMS microphone or an analog output MEMS microphone.

12. The MEMS device according to claim 1, wherein the integrated circuitry comprises an ASIC, and wherein the ASIC comprises the second integrated interface.

13. A CODEC for use with the MEMS device according to claim 1, wherein the external processing device comprises the CODEC, wherein the CODEC comprises a communication interface, and wherein the CODEC is configured to perform at least one of:
providing, at run-time, a control information via the communication interface for the MEMS device, or
receiving, at run-time, the diagnostic data on the current condition of the MEMS device, via the communication interface, from the MEMS device.

14. A method for operating an adaptive microelectromechanical system (MEMS) device comprising integrated circuitry electrically connected to a MEMS microphone, the method comprising:
reading out, by the integrated circuitry, a non-stimulated sensed output signal from the MEMS microphone;
providing, by the integrated circuitry, the non-stimulated sensed output signal or a rendered version of the non-stimulated sensed output signal to an external processing device, via a first integrated interface;
determining, by the integrated circuitry, at run-time, diagnostic data on a current condition of the MEMS device, by comparing the non-stimulated sensed output signal to a reference value or reference signal, thereby synergistically using the integrated circuitry for both reading out the non-stimulated sensed output signal and determining the diagnostic data; and
providing, by the integrated circuitry, at run-time, the diagnostic data to the external processing device, via a second integrated interface.

15. The method according to claim 14, wherein determining, at run-time, the diagnostic data further comprises:
stimulating, with a test stimulus, the MEMS device and evaluating a resulting response signal in reaction to the test stimulus in order to determine the diagnostic data.

16. A non-transitory computer-readable storage medium having stored thereon a computer program having a program code for performing, when running on a computer, the method according to claim 14.

17. The method according to claim 14, wherein determining, at run-time, the diagnostic data further comprises:
stimulating, at run-time, a resonance frequency of the MEMS device and evaluating a resulting resonance response of the MEMS device in reaction to the stimulation of the resonance frequency in order to determine the diagnostic data.

18. The method according to claim 14, further comprising receiving, by the integrated circuitry, at run-time, a control information for setting an operation characteristic of the MEMS device from the external processing device.

19. The method according to claim 18, further comprising determining, at run-time, the diagnostic data based on the control information received, at run-time, from the external processing device.

20. The method according to claim 18, further comprising controlling an operating condition of the MEMS microphone based on the control information.

* * * * *